US012755944B2

(12) United States Patent
Chadha

(10) Patent No.: US 12,755,944 B2
(45) Date of Patent: Oct. 6, 2026

(54) ELECTROSTATICALLY SECURED SUBSTRATE SUPPORT ASSEMBLY

(71) Applicant: Applied Materials, Inc., Santa Clara, CA (US)

(72) Inventor: Arvinder Manmohan Singh Chadha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 18/743,656

(22) Filed: Jun. 14, 2024

(65) Prior Publication Data

US 2025/0385081 A1 Dec. 18, 2025

(51) Int. Cl.
*H01J 37/32* (2006.01)
*H10P 72/72* (2026.01)

(52) U.S. Cl.
CPC .. *H01J 37/32724* (2013.01); *H01J 37/32477* (2013.01); *H10P 72/722* (2026.01); *H01J 2237/002* (2013.01); *H01J 2237/0206* (2013.01); *H01J 2237/2005* (2013.01); *H01J 2237/2007* (2013.01)

(58) Field of Classification Search
CPC ........... H01J 37/32724; H01J 37/32477; H01J 2237/002; H01J 2237/0206; H01J 2237/2005; H01J 2237/2007; H10P 72/722
USPC .......................................................... 361/234
See application file for complete search history.

(56) References Cited

U.S. PATENT DOCUMENTS 5,155,652 A * 10/1992 Logan ...................... H10P 72/72 279/128
2007/0258186 A1* 11/2007 Matyushkin ............ H10P 72/72 361/234
2019/0189492 A1* 6/2019 Parkhe ................ H10P 72/0432

FOREIGN PATENT DOCUMENTS

JP 09237826 A * 9/1997
JP 2022123983 A 8/2022
KR 20200005771 A 1/2020
WO WO-2022240418 A1 * 11/2022 ......... C23C 16/4586

OTHER PUBLICATIONS

International Search Report and Written Opinion for International Application No. PCT/US2025/033099, mailed Sep. 30, 2025, 13 Pages.

* cited by examiner

*Primary Examiner* — Sreeya Sreevatsa
(74) *Attorney, Agent, or Firm* — Lowenstein Sandler LLP

(57) ABSTRACT

A substrate support assembly includes a cooling plate. The substrate support assembly further includes a chuck disposed on the cooling plate. The chuck includes one or more clamp electrodes to electrostatically secure the chuck to the cooling plate. The substrate support assembly further includes multiple mesas formed on a bottom surface of the chuck or formed on a top surface of the cooling plate to separate the chuck from the cooling plate.

20 Claims, 13 Drawing Sheets

ELECTROSTATICALLY SECURED SUBSTRATE SUPPORT ASSEMBLY

TECHNICAL FIELD

Some embodiments of the present disclosure relate, in general, to a substrate support assembly having one or more puck plates and a cooling plate, which are attached together using one or more clamp electrodes.

BACKGROUND

Chucks are widely used to hold and secure substrates, such as semiconductor wafers, during various substrate processes like etching, deposition, and lithography. The specific type of chuck used depends on the specific specifications of the semiconductor manufacturing process, including factors such as wafer size, material, temperature sensitivity, and process compatibility. Some commonly used chucks include vacuum chucks, electrostatic chucks, mechanical chucks, magnetic chucks, piezoelectric chucks, wafer carrier chucks, edge grip chucks, heated chucks, and coolant chucks.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some embodiments described herein cover a substrate support assembly. The substrate support assembly includes a cooling plate. The substrate support assembly further includes a chuck disposed on the cooling plate. The chuck includes one or more clamp electrodes to electrostatically secure the chuck to the cooling plate. The substrate support assembly further includes multiple mesas formed on a bottom surface of the chuck or formed on a top surface of the cooling plate to separate the chuck from the cooling plate.

Additional embodiments described herein cover a substrate support assembly. The substrate support assembly includes a cooling plate forming a void on a top surface of the cooling plate. The substrate support assembly further includes a chuck disposed on the cooling plate. The chuck includes one or more clamp electrodes to electrostatically secure the chuck to the cooling plate. The substrate support assembly further includes a metal disc disposed within the void and between the cooling plate and the chuck. The metal disc includes a protective coating on at least one surface of the metal disc.

Further embodiments described herein cover a substrate support assembly. The substrate support assembly includes a cooling plate and a chuck disposed on the cooling plate. The chuck includes one or more clamp electrodes to electrostatically secure the chuck to the cooling plate. The chuck further includes one or more ring-shaped protrusions extending from a bottom surface of the chuck. The one or more ring-shaped protrusions are configured to interface with one or more corresponding grooves formed in a top surface of the cooling plate. The one or more ring-shaped protrusions and the one or more corresponding grooves form a labyrinth seal between the cooling plate and the chuck.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to “an” or “one” embodiment in this disclosure are not necessarily to the same embodiment, and such references mean at least one.

DETAILED DESCRIPTION OF EMBODIMENTS

Figure 1:
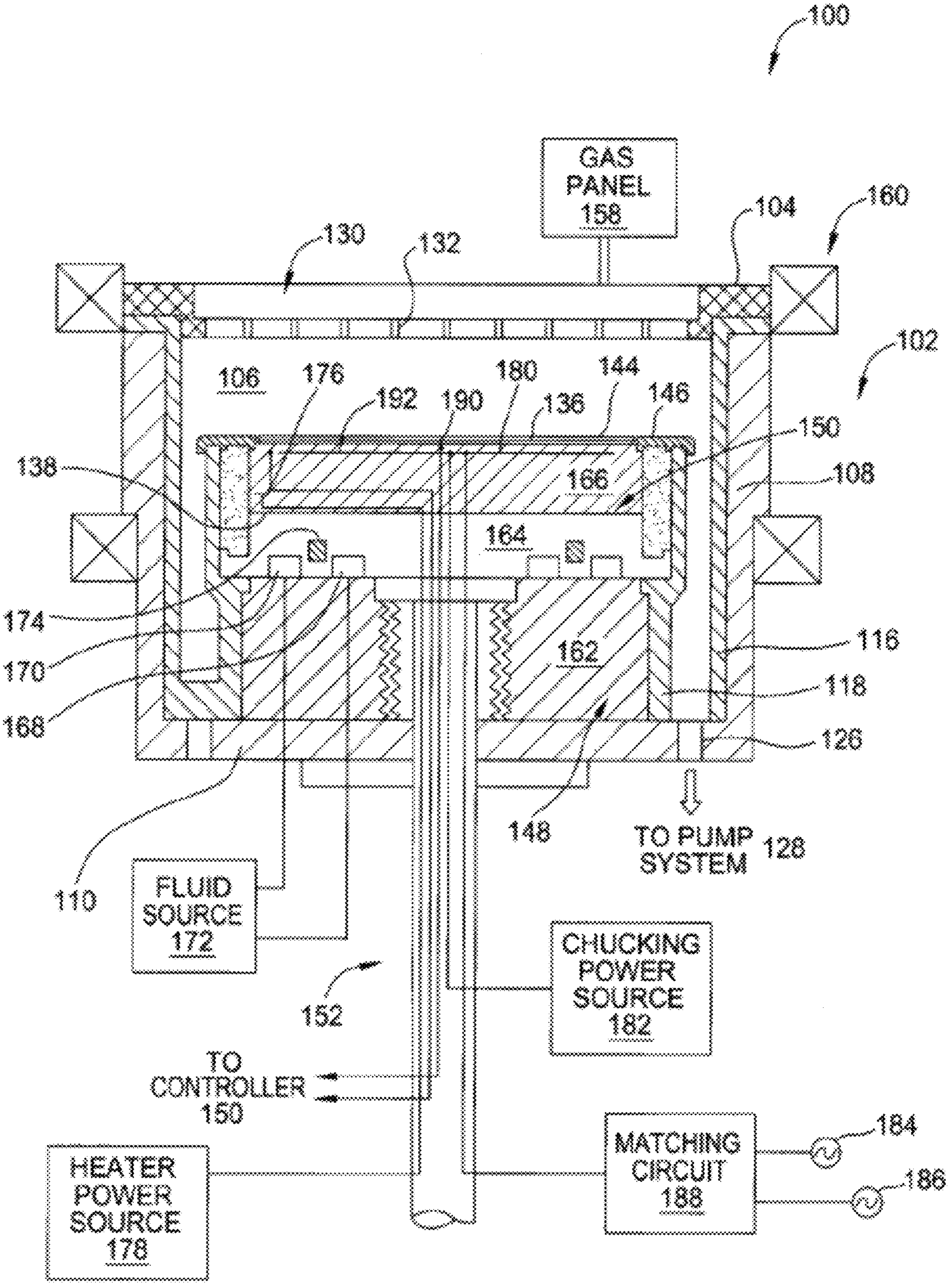
FIG. 1 depicts a sectional side view of a processing chamber, according to some embodiments.

Embodiments of the present disclosure provide a substrate support assembly including a chuck having one or more components that are electrostatically secured to a cooling plate and/or other plate of the substrate support assembly.

Electrostatic chucks (ESCs) typically include one or more electrodes embedded within a unitary chuck body, which includes a dielectric or semi-conductive ceramic material across which an electrostatic clamping field can be generated to chuck a substrate. Heating elements may be included in the electrostatic chucks to heat a supported substrate.

ESCs are traditionally formed from a single, monolithic, ceramic body that includes all the functional elements of the electrostatic chuck. An organic bonding material is traditionally used to bond the ceramic body to a metal cooling plate, which limits power dissipation for high temperature processes such as etching. High temperatures or cryogenic temperatures may be used for high plasma power for etching or high surface temperatures may be needed to etch hard masks. High temperature etching may involve etching dielectric films including oxides, nitrides, or hafnium oxides; semi-conducting films including poly-Si, p-doped Si, n-doped Si, or Si; metal films including W, Cu, Al, Mo, or Ni; or combinations thereof. However, due to the use of an organic bonding material, current electrostatic chucks may not be suitable for high temperature applications.

In some embodiments, electrostatic chucks may use metal cooling plates that may be coated with a dielectric using spray coating, anodization, or a combination thereof. However, the quality of the coating may degrade due to stress, fatigue, and/or creep that may result from thermal cycling and may eventually lead to arcing. Stresses within the electrostatic chuck may arise due to difference in the coefficients of thermal expansion of the materials used in forming the electrostatic chuck. Plasma may also wear off the bond material bonding two or more components of the electrostatic chuck, which may result in degrading performance across the wafer. As a result, the plates forming the chuck may be replaced from time to time. However, replacement of a plate can be a time consuming and laborious process. For example, the plates are first separated from the cooling plate, which may involve prying open the plates. Then the bonding layer that bonds the plates to the cooling plate is removed from the cooling plate's surface using a solution that dissolves the bonding material, or by laser removal, or by thermal decomposition of the bond material, before a replacement plate can be installed. In some instances, the plates may crack during the separation process and may become unrecoverable. Consequently, replacement of the plates may impact efficiency of the semiconductor manufacturing process.

Moreover, some electrostatic chucks use a bond material to bond the chuck to the cooling plate. An o-ring may be used to protect the bond material from harmful and/or corrosive process chemistries. However, the o-rings may degrade over time and/or may limit the usable conditions for the electrostatic chuck. For example, an electrostatic chuck with o-ring(s) may be temperature-limited, meaning the electrostatic chuck cannot be used in processing environments with extreme temperatures that may damage the o-ring(s).

Embodiments of the present disclosure provide a substrate support assembly having a chuck (e.g., for securing a substrate during processing operation(s)). The chuck may be a vacuum chuck, an electrostatic chuck, a mechanical chuck, a magnetic chuck, a piezoelectric chuck, a wafer carrier chuck, an edge grip chuck, a heated chuck, or a coolant chuck. The chuck may have one or more clamp electrodes to electrostatically secure the chuck to the cooling plate. The clamp electrodes may be disposed closer to a bottom surface of the chuck so that the chuck is tightly secured to the cooling plate. Alternatively, or in addition, one or more clamp electrodes may be disposed closer to a top surface of the chuck and a greater potential may be applied so that the chuck is tightly secured to the cooling plate. In an alternative implementation, the chuck may include multiple plates, and one or more upper plates of the chuck may be electrostatically secured to one or more lower plates of the chuck.

The chuck may include additional clamp electrodes disposed closer to a top surface to secure a substrate or a wafer thereon. The substrate support assembly may be able to support high temperature (e.g., greater than 150° C.) applications as well as low temperature (e.g., lesser than −150° C.) applications in embodiments. In some embodiments, the substrate support assembly may include a cooling plate, which enhances power dissipation for high temperature processes such as etching. The cooling plate may be a ceramic cooling plate. Alternatively, the cooling plate may be a metal cooling plate. Embodiments are also directed to a dielectric cooling plate usable in a substrate support assembly. The dielectric cooling plate may include one or more clamp electrodes that secure the chuck onto the cooling plate. The clamp electrodes may be disposed in one or more plates of the dielectric cooling plate. The substrate support assembly may be used in processes where high plasma power may be used (e.g., dielectric film etching) or where high surface temperatures may be used to etch hard masks, for example. Additionally, in some embodiments since both the chuck and the cooling plate are made of a dielectric material (e.g., which may have the same or nearly the same coefficient of thermal expansion (CTE) and thermal conductivity), the disclosed substrate support assemblies do not degrade, or minimally degrade, due to stress, fatigue, and/or creep that may result from thermal cycling.

In some embodiments, a substrate support assembly includes a cooling plate. The cooling plate may have a protective coating, such as a protective anodized coating (e.g., an $Al_2O_3$ coating over an Al cooling plate), on a top surface. The substrate support assembly may further include a chuck, such as an electrostatic chuck, disposed on the cooling plate. The chuck may include one or more clamp electrodes to electrostatically secure the chuck to the cooling plate. For example, voltage may be applied to the clamp electrodes for generation of an electrostatic clamping force to secure the chuck to the cooling plate. In some embodiments, the chuck is supported on the cooling plate by multiple mesas. The mesas may be formed on the bottom surface of the chuck or on a top surface of the cooling plate. The multiple mesas may form multiple gas channels for flowing a heat transfer gas between the chuck and the cooling plate. In some embodiments, the chuck may include one or more other functional elements, such as a clamp electrode a heat element, a zone heater, a pixelated heater, a radio frequency (RF) electrode, and/or a RF filter, etc. In some embodiments, the protective coating on the cooling plate may be to prevent arcing, such as from the RF electrode, to the cooling plate. Examples of materials that may be used in forming the chuck and the cooling plate include niobium, aluminum oxide, aluminum nitride, single crystal alumina, or sapphire.

In some embodiments, the cooling plate forms a void on a top surface of the cooling plate. The substrate support assembly may include a metal disc disposed within the void and between the cooling plate and the chuck. The metal disc may include a protective coating (e.g., an anodized coating). The protective coating may resist arcing. In some embodiments, inclusion of the metal disc between the chuck and the cooling plate may enable the substrate support assembly to be used in high temperature environments such as in high temperature processing environments.

In some embodiments, the chuck includes one or more ring-shaped protrusions extending from a bottom surface of the chuck. The ring-shaped protrusions may interface with corresponding ring-shaped grooves formed in the top surface of the cooling plate. For example, the ring-shaped protrusions of the chuck may fit into the ring-shaped grooves of the cooling plate. In some embodiments, the ring-shaped protrusions are formed near the outer periphery of the chuck and the corresponding grooves are formed near the outer periphery of the cooling plate. In some embodiments, the ring-shaped protrusions and the corresponding grooves form a labyrinth seal between the cooling plate and the chuck. The labyrinth seal may be formed to protect components of the chuck and/or cooling plate that are disposed near the center of the chuck and/or cooling plate (e.g., such as wire leads, electrodes, gas channels, etc.) from corrosive or otherwise harmful process chemistries in the processing environment.

Embodiments of the present disclosure provide advantages over conventional solutions. By providing a cooling plate having a protective coating, arcing between electrodes and the cooling plate can be reduced or eliminated, thus leading to more consistent and accurate processing of substrates and less damage to the cooling plate and/or to other components. Additionally, by providing a substrate support where the chuck is supported on the cooling plate by mesas (e.g., mesas formed either on the bottom surface of the chuck or on the top surface of the cooling plate), a gas can be flowed between the mesas to enhance heat transfer between the chuck and the cooling plate. Moreover, by providing a substrate support where the chuck and the cooling plate form a labyrinth seal near the outer periphery, components or portions of the substrate support that are disposed near the center of the substrate support may be protected from corrosive or otherwise harmful gases and/or process chemistries in the processing environment. Therefore, a substrate support assembly as described herein may have a longer service life compared with conventional substrate support assemblies and may provide for more accurate and consistent processing of substrates.

FIG. 1 is a sectional view of one embodiment of a processing chamber 100 having a substrate support assembly 150 disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, a mechanical chuck assembly, a magnetic chuck assembly, a piezoelectric chuck assembly, a wafer carrier chuck assembly, an edge grip chuck assembly, a heated chuck assembly, a coolant chuck assembly, and so on. In one embodiment, the substrate support assembly 150 includes a puck assembly (also referred to as a chuck) 166. The puck assembly may include one or more puck plates. The substrate support assembly 150 may additionally include two or more plates, where each plate may include zero or more different functional elements of the substrate support assembly (e.g., clamp electrodes, radiofrequency (RF) electrodes, main heating electrodes, auxiliary heating electrodes, cooling channels, and so on). The substrate support assembly 150 may further include a cooling plate 164, which may be formed from a metal or a dielectric material (e.g., ceramic). The puck assembly 166 and the cooling plate 164 may be separated by an interface layer including a metal, an organic material, a polymer, or combinations thereof.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the sidewalls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In some embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 is part of a greater assembly 148 that includes the substrate support assembly 150 as well as a mounting plate 162 supporting a pedestal 152. In one embodiment, the substrate support assembly 150 further includes a thermally conductive base referred to herein as a cooling plate 164 coupled to a puck assembly (also referred to as a puck plate assembly) 166. In some embodiments, the puck assembly 166 is supported on the cooling plate 164 by multiple mesas. The mesas may be formed on the bottom surface of the puck assembly 166 or on the top surface of the cooling plate. In some embodiments, the puck assembly 166 and the cooling plate 164 together form a labyrinth seal proximate the outer periphery to the substrate support. The labyrinth seal may be to protect inner components, such as utility components (e.g., fluids, power lines, sensor leads, etc.) from corrosive and/or harmful process chemistries in volume 106.

In one embodiment, the cooling plate 164 is electrostatically coupled to the puck assembly 166 by energizing one or more clamping electrodes. The cooling plate 164 may alternatively be coupled to the puck assembly 166 using a dielectric material and/or by a bonding layer. In some embodiments, the cooling plate 164 has a protective coating on at least one surface. For example, the cooling plate 164 may have a protective coating on at least a top surface. In some embodiments, the protective coating on the cooling plate 164 is an arcing-resistant protective coating, such as an anodized coating. The substrate support assembly 150 described in embodiments may be used for Johnsen-Rahbek and/or Coulombic electrostatic chucking of substrates in embodiments. In some embodiments, the puck plate assembly (e.g., chuck) 166 is electrostatically secured to the cooling plate using Johnsen-Rahbek and/or Coulombic electrostatic chucking. The substrate support assembly 150 may additionally or alternatively be used as a heater, such as a deposition heater that is configured to heat a support substrate 144 during a deposition process.

In one embodiment, a protective ring 146 is disposed over a portion of the puck assembly 166 at an outer perimeter of the puck assembly 166. In one embodiment, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In some embodiments, the puck assembly 166 is a single monolithic ceramic puck plate. In some embodiments, the puck assembly 166 may include an upper puck plate (not shown) and a lower puck plate (not shown) bonded by a metal and/or organic bond. In some embodiments, the puck assembly 166 may include two or more plates that may be secured to each other using clamp electrodes that may be disposed in one or more plates. The puck assembly 166 and/or the cooling plate 164 may be formed from a monolithic dielectric or electrically insulative material (e.g., having an electrical resistivity of greater than 1014 Ohm meter) that is usable for semiconductor processes at temperatures of 150° C. and above. In one embodiment, the puck assembly 166 and/or the cooling plate 164 is composed of materials usable from about 20° C. to about 500° C. In one embodiment, the puck assembly 166 and/or the cooling plate 164 is AlN, $Al_2O_3$, or another ceramic. The puck assembly 166 and/or the cooling plate 164 may be undoped or may be doped. For example, the AlN or $Al_2O_3$ may be doped with Samarium oxide ($Sm_2O_3$), Cerium oxide ($CeO_2$), Titanium dioxide ($TiO_2$), or a transition metal oxide. In one embodiment, the puck assembly 166 and/or the cooling plate 164 include $Al_2O_3$. The $Al_2O_3$ puck assembly 166 and/or the cooling plate 164 may be undoped or may be doped. For example, the $Al_2O_3$ may be doped with Titanium dioxide ($TiO_2$) or a transition metal oxide. In some embodiments, each of the puck assembly 166 and/or the cooling plate 164 may be formed of a same ceramic. In other embodiments, puck assembly 166 and/or the cooling plate 164 may formed of the same ceramic material, different ceramic materials, the same ceramic material with different purities, the same ceramic material with different grain sizes, different ceramic materials with different grain sizes, or different ceramic materials with different purities.

The puck assembly 166 may have a coefficient of thermal expansion (CTE) and/or thermal conductivity that is matched or close to that of the cooling plate 164. In one embodiment, the puck assembly 166 and/or the cooling plate 164 is a SiC porous body that is infiltrated with an AlSi alloy (referred to as AlSiSiC). The puck assembly 166 and/or the cooling plate 164 may alternatively be AlN or $Al_2O_3$ or other ceramic material or a combination thereof (e.g., aluminum oxynitride (ALON)). In one embodiment, the puck assembly 166 and/or the cooling plate 164 include undoped AlN or undoped $Al_2O_3$. In one embodiment, the puck assembly 166 is composed of the same material as the cooling plate 164. The AlSiSiC material, AlN or $Al_2O_3$ may be used, for example, in reactive etch environments or in inert environments.

In one embodiment, the puck assembly 166 and/or the cooling plate 164 is Molybdenum. Molybdenum may be used, for example, if the puck assembly 166 is to be used in an inert environment. Examples of inert environments include environments in which inert gases such as Ar, $O_2$, N, etc. are flowed. Molybdenum may be used, for example, if the puck assembly 166 is to chuck a substrate for metal deposition. Molybdenum may also be used for the cooling plate 164 for applications in a corrosive environment (e.g., etch applications). In such an embodiment, exposed surfaces of the puck assembly 166 and/or the cooling plate 164 may be coated with a plasma resistant coating. The plasma coating may be performed via a plasma spray process. The plasma resistant coating may cover, for example, side walls of the cooling plate and an exposed horizontal step of the cooling plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In embodiments, different functions of the puck assembly 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck assembly 166 may include RF electrodes, clamp electrodes, and/or heating electrodes. In one embodiment, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166, consequently heating and/or cooling the puck assembly 166 and a substrate (e.g., a wafer) being processed. In one embodiment, the puck assembly 166 includes two separate heating zones that can maintain distinct temperatures. In another embodiment, the puck assembly 166 includes four or more different heating zones that can maintain distinct temperatures. The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166 and/or in a lower surface of a bottom-most plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144 and/or between the puck assembly 166 and the cooling plate 164.

In one embodiment, the puck assembly 166 include one or more clamping electrodes 180 controlled by a chucking power source 182. The clamping electrodes 180 may be used to clamp the puck assembly 166 to the cooling plate 164 and/or the wafer to the puck assembly 166. In one embodiment, puck assembly 166 includes at least two clamping electrodes 180, where a first clamping electrode is used to electrostatically clamp a substrate to the puck assembly 166 and a second clamping electrode is used to electrostatically clamp the puck assembly 166 to cooling plate 164. In one embodiment, the first and second clamping electrodes are connected to different power sources. In one embodiment, the first and second clamping electrodes are connected to a same power source.

The clamping electrodes 180 may be included in one or more plates of puck assembly 166. The clamping electrodes 180 (also referred to as clamp electrodes) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
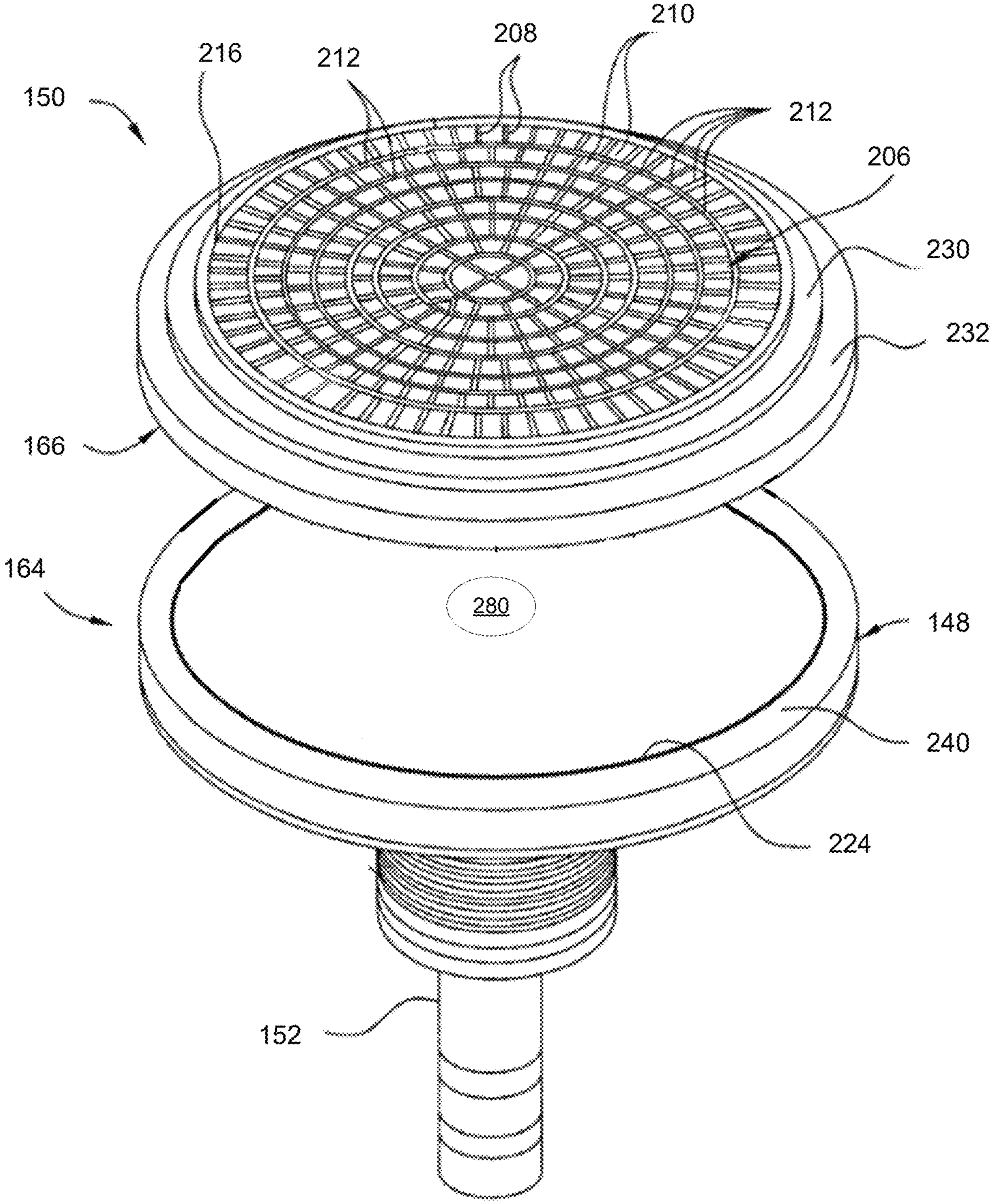
FIG. 2 depicts an exploded view of a substrate support assembly, according to some embodiments.

FIG. 2 depicts an exploded view of one embodiment of the substrate support assembly 150. The substrate support assembly 150 includes the puck assembly 166 and the cooling plate 164 including the pedestal 152. In some embodiments, the cooling plate 164 may be attached to the puck assembly 166 using one or more clamp electrodes (e.g., clamp electrodes 180). The interior volumes within the substrate support assembly 150 may include open spaces 280 within the pedestal 152 for routing conduits and wiring.

In some embodiments, in addition to, or instead of, clamping using the clamp electrodes 180, the puck assembly 166 and the cooling plate 164 can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy. Examples of materials that may be used in forming the puck assembly 166 and the dielectric cooling plate 164 include niobium, aluminum oxide, aluminum nitride, single crystal alumina, or sapphire. The puck assembly 166 and the dielectric cooling plate 164 may be individually formed using a hot press, a hot isostatic press, a green sheet, a gel cast, or a sol gel process, for example.

The puck assembly 166 may include one or more embedded functional elements, which may include a clamp electrode, a heating element, a zone heater, a pixelated heater, a radio frequency (RF) electrode, a RF filter, a gas channel, a cooling channel, or combinations thereof. In one embodiment, the puck assembly 166 may include two or more pairs of clamp electrodes. One pair of clamp electrodes may be energized to secure the puck assembly 166 to the cooling plate 164, and another pair of clamp electrodes may be energized to secure a substrate or wafer to the puck assembly 166. The cooling plate 164 may include one or more cooling loops or channels to circulate a cooling fluid (e.g., a coolant or a refrigerant or gas). The cooling plate 164 may further include one or more channels for a gas (e.g., inert gas) to flow therethrough. The puck assembly 166 and the cooling plate 164 may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck assembly 166 include niobium, aluminum oxide, aluminum nitride, single crystal alumina, or sapphire. Examples of materials that may be used in forming the cooling plate 164 include aluminum, alumina, and so on.

In one embodiment, the puck assembly 166 has a disc-like shape having an annular periphery that may substantially match the shape and size of the substrate 144 positioned thereon. An upper surface of the puck assembly 166 may have an outer ring 216, multiple mesas 206, 210 and channels 208, 212 between the mesas 210. In one embodiment, the puck assembly 166 includes an upper puck plate 230 bonded to the lower puck plate 232 by a metal bond, a ceramic bond, an organic bond, a polymer bond, or other type of bond. In one embodiment, the lower puck plate 232 may be bonded to the cooling plate 164 and the upper puck plate 230 may include one or more clamp electrodes that may be used to attach (e.g., electrostatically secure) the upper puck plate 230 to the lower puck plate 232. In one embodiment, a bond or interface layer between the two puck plates has different thermal conductivity in different directions. For example, the bond or interface layer may have different thermal conductivity in the x, y and/or z directions. In some embodiments, the bond or interface layer comprises a ceramic with metal fillers (e.g., having ellipsoid particles). The metal fillers may alter a thermal conductivity of the bond in a targeted direction. The thermal conductivity of the bond or interface layer may accordingly be tailored in one or more directions or planes so that it has isotropic or anisotropic heat transfer properties. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material or cooling plate 164 in order to minimize CTE mismatch and avoid thermo-mechanical stresses which may damage the puck assembly 166 during thermal cycling. In one embodiment, the lower puck plate 232 is Molybdenum. In one embodiment, the lower puck plate is alumina. In one embodiment, the lower puck plate is AlN or $Al_2O_3$. The lower puck plate may be composed of a same material as the upper puck plate or cooling plate 164, but may have a different purity level, a different grain size, different amounts of dopants, and so on to provide different material properties for the lower puck plate than the upper puck plate in embodiments.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The cooling plate 164 attached below the puck assembly 166 may have a disc-like main portion 224, which may accommodate an interface layer as described in the later sections, and an annular flange 240 extending outwardly from the main portion 224 and positioned on the pedestal 152. Additionally, the main portion 224 may include protrusions or grooves (not shown) that may correspond to grooves or protrusions formed on a bottom surface of the lower puck plate 232 for properly aligning the puck assembly 166 with the cooling plate 164. For example, a bottom surface of the chuck and a top surface of the cooling plate may include a mating feature to align the chuck with the cooling plate. In one embodiment, the cooling plate 164 may be fabricated by a composite ceramic, such as an aluminum-silicon alloy infiltrated SiC or Molybdenum to match a thermal expansion coefficient of the puck assembly 166.

Figure 3:
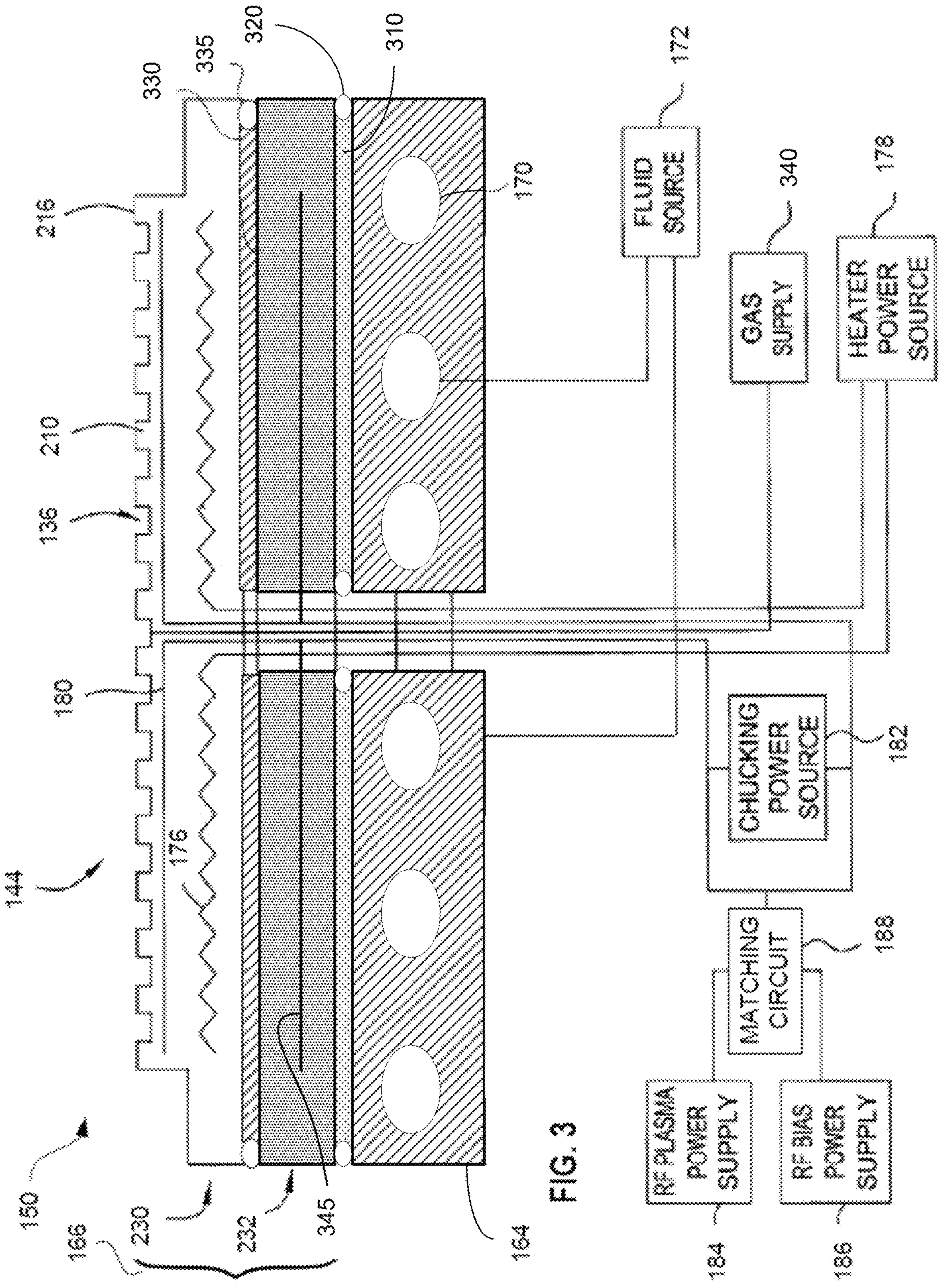
FIG. 3 depicts a sectional side view of a substrate support assembly, according to some embodiments.

FIG. 3 depicts a sectional side view of one embodiment of a substrate support assembly 150. The substrate support assembly 150 includes a puck assembly 166 including one or more puck plates, such as two plates, three plates, four plates, five plates, and so on. In some embodiments, the puck assembly 166 may include a top plate 230 and a bottom plate 232. In some embodiments, the puck assembly 166 is a monolithic assembly including a single plate. Puck plate 232 may be permanently bonded to the cooling plate 164 using a bonding layer 310. Different techniques may be used to bond the puck plate 232 to the cooling plate 164. One technique that may be used for bonding is metal bonding. Polymer bonding, diffusion bonding, organic bonding, and so on may also be performed to bond plates together. In one embodiment, diffusion bonding is used as a method of metal bonding the bottom plate 232 to the cooling plate 164. One or more o-rings 320 may surround bonding layer 310 to protect the bonding layer 310 contained between the puck plate 232 and cooling plate 164.

The top plate 230 may include mesas 210, channels 212 and optionally an outer ring 216. In one embodiment, the puck plate 230 includes functional elements such as one or more clamping electrodes 180, one or more heating elements 176, and/or one or more RF electrodes (not shown). Alternatively, the clamping electrodes 180, heating elements 176, and RF electrodes may be disposed in different plates. The clamping electrodes 180 may be coupled to a chucking power source 182, and/or to an RF plasma power supply 184 and/or an RF bias power supply 186 via a matching circuit 188. Similarly, puck plate 232 may include one or more clamp electrodes 345, which may be used to clamp the bottom puck plate 232 to the top puck plate 230. In some embodiments, clamp electrodes 345 and 180 may be connected to the same power source. In some embodiments, clamp electrodes 345 and 180 may be connected to different power sources. The puck plates 230, 232 and/or other plates may additionally include gas delivery holes (not shown) through which a gas supply 340 pumps a backside gas such as He. Additionally, the puck plates 230, 232 and/or other plates may additionally include one or more cooling holes (not shown) for a cooling fluid to flow therethrough.

The puck plates 230, 232 and/or other plates may have a thickness of about 1-25 mm or more in some embodiments. The clamping electrodes 180 may be located about 0.25 mm from an upper surface of the puck plate 230, the heating elements 176 may be located about 1 mm under the clamping electrodes 180, and RF electrodes may be located about 0.5 mm under the heating elements 176 in one example. In some embodiments, the top plate 230 may have additional clamp electrodes, similar to clamp electrodes 180, that may be located closer to a bottom surface of top plate 230. The additional clamp electrodes may be used to secure the top plate 230 to the bottom plate 232, as described below. The heating elements 176 may be screen printed heating elements having a thickness of about 10-200 microns in some embodiments. Alternatively, the heating elements may be resistive coils that use about 1-3 mm of thickness of the puck plate 230 in some embodiments. In such an embodiment, the puck plate 230 may have a minimum thickness of about 5 mm. In some embodiments, the puck plates have thicknesses ranging from 1 mm to 10 mm, 2 mm to 8 mm, or other thicknesses. In embodiments, different puck plates may have the same or different thicknesses, which may range from 1-25 mm, for example.

The heating elements 176 are electrically connected to a heater power source 178 for heating the puck plate 230. The puck plate 230 may include electrically insulative materials such as AlN. In one embodiment, the puck plate 230 is composed of a metal matrix composite material. In one aspect, the metal matrix composite material includes aluminum and silicon. In one embodiment, the metal matrix composite is a SiC porous body infiltrated with an AlSi alloy.

In some embodiments, an interface layer 330 may be used to separate the top plate 230 from the bottom plate 232. The interface layer 330 may have a coefficient of thermal expansion and/or thermal conductivity that is close to that of the top plate 230 and/or bottom plate 232. In some embodiments, interface layer 330 may include an organic material, such as a polymer. One or more o-rings 335 may surround interface layer 330 to keep the interface layer 330 contained between the puck plate 232 and puck plate 230.

The puck plate 232 is coupled to and in thermal communication with a cooling plate 164 having one or more conduits 170 (also referred to herein as cooling channels) in fluid communication with fluid source 172. In one embodiment, the cooling plate 164 is coupled to the puck plate 232 using a dielectric material (e.g., a ceramic layer). Larger separation may decrease heat transfer, and cause the interface between the puck assembly 166 and the cooling plate 164 to act as a thermal choke. In one embodiment, a conductive gas may be flowed into the conduits 170 to improve heat transfer between the puck assembly 166 and the cooling plate 164. In some embodiments, an o-ring or gasket is not used between puck assembly 166 and cooling plate 164. In some embodiments, a separation between puck assembly 166 and cooling plate 164 minimizes the contact area between the puck assembly 166 and the cooling plate 164.

In some embodiments, the plate 232 and the cooling plate 164 are not bonded together. In such embodiments, fasteners may be used to couple the plate 232 and the cooling plate 164 together. For example, plate 232 and cooling plate 164 may each include features for accommodating a threaded insert and/or ahead of a threaded fastener. The threaded fastener may then extend between the plate 232 and the cooling plate 164 and be tightened against the threaded insert in the cooling plate. In some embodiments, plate 232 and cooling plate 164 are electrostatically secured together rather than being bonded together or being secured by fasteners.

In one embodiment (not shown), a grafoil layer or other flexible graphite layer is disposed between the puck assembly 166 and the cooling plate 164. The flexible graphite may have a thickness of about 10-40 mil. The flexible graphite may be thermally conductive, and may improve a heat transfer between the puck assembly 166 and the cooling plate 164.

In one embodiment, the cooling plate 164 includes a base portion (not shown). In one embodiment, the cooling plate 164 includes a spring loaded inner heat sink connected to the base portion by one or more springs. The springs apply a force to press the inner heat sink against the puck assembly 166. A surface of the heat sink may have a predetermined roughness and/or surface features (e.g., mesas) that control heat transfer properties between the puck assembly 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

Figure 4A:
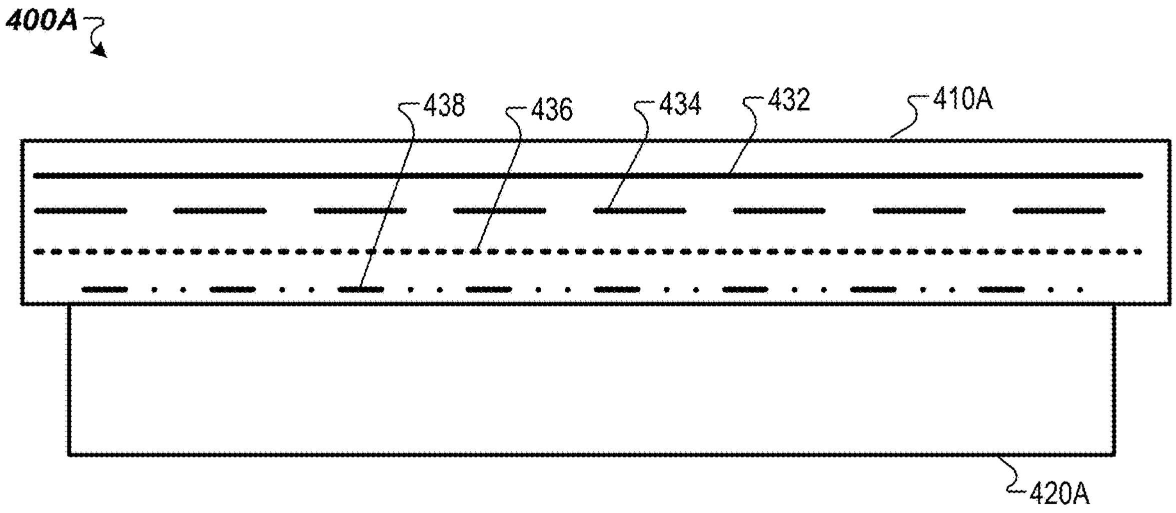
FIGS. 4A-F depict schematic side views of a substrate support assembly, according to some embodiments.

FIGS. 4A-F depict schematic side views of a substrate support assembly, according to some embodiments. Referring to FIG. 4A, a schematic side view of a substrate support assembly 400A is shown. In some embodiments, a chuck 410A is disposed on top of a cooling plate 420A. Multiple functional elements may be disposed within the chuck 410, such as a substrate clamp electrode 432, an RF electrode 434, a heating element 436, and/or a clamping electrode 438. The clamping electrode 438 may be an electrode to electrostatically secure the chuck 410A to the cooling plate 420A. For example, the clamping electrode 438 may be energized (e.g., with a voltage) to generate an electrostatic clamping force to electrostatically clamp the chuck 410A to the cooling plate 420A. The clamping electrode 438 may be a mono-polar electrode or a bi-polar electrode. In some embodiments, the chuck 410A can be removed from the cooling plate 420A for replacement. In some embodiments, the cooling plate 420A and/or the chuck 410A include one or more passageways, etc. for the routing of utilities such as power leads, etc. for the functional elements.

Figure 4B:
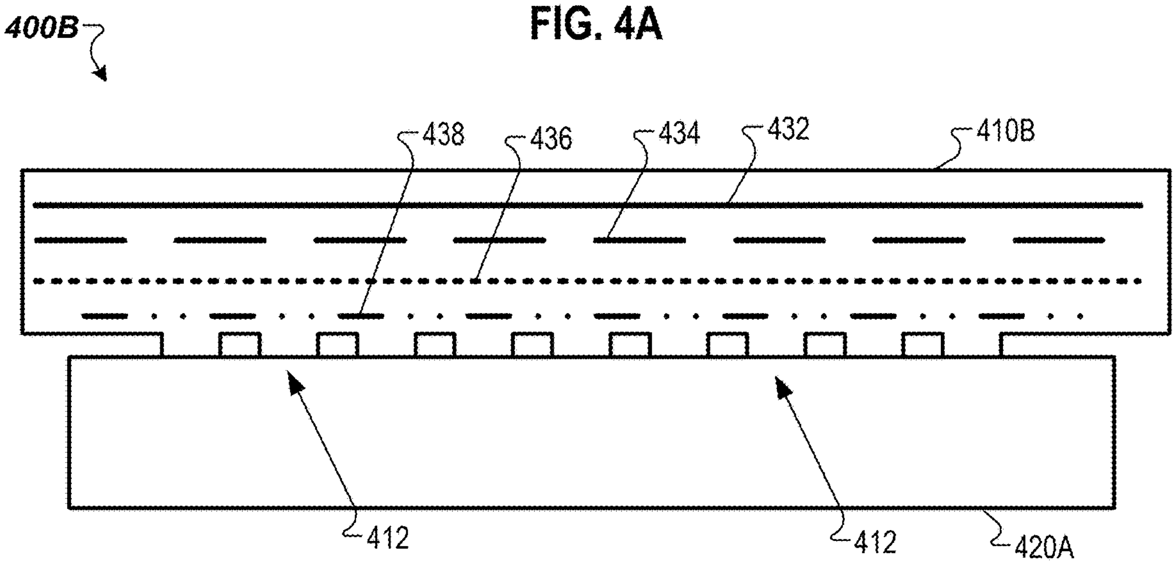

Referring to FIG. 4B, a schematic side view of a substrate support assembly 400B is shown. In some embodiments, a chuck 410B is supported on top of the cooling plate 420A by multiple mesas 412. In some embodiments, the multiple mesas 412 are to separate the chuck 410B from the cooling plate 420A. The multiple mesas 412 may be formed in a bottom surface of the chuck 410B. In some embodiments, the multiple mesas form multiple gas channels between the mesas for fling a heat transfer gas between the chuck 410B and the cooling plate 420A. In some embodiments, the mesas 412 have a height between approximately 1 micron and approximately 2,000 microns. In some embodiments, the mesas have a height between approximately 10 microns and approximately 50 microns. In some embodiments, the mesas 412 have a height between approximately 400 microns and approximately 1,800 microns. In some embodiments, the mesas have a height between approximately 800 microns and approximately 1,600 microns. In some embodiments, the mesas 412 have a height between approximately 1,000 microns and approximately 1,400 microns. In some embodiments, the multiple mesas 412 reduce a contact area between the chuck 410B and the cooling plate 420A when compared to substrate support assembly 400A. For example, and in some embodiments, the contact area between the chuck 410B and the cooling plate 420A may be between approximately 1% and approximately 90% of an interface area formed between the chuck 410B and the cooling plate 420A. In some embodiments, the contact area between the chuck 410B and the cooling plate 420A may be between approximately 1% and approximately 80% of an interface area formed between the chuck 410B and the cooling plate 420A, the contact area between the chuck 410B and the cooling plate 420A may be between approximately 30% and approximately 60% of an interface area formed between the chuck 410B and the cooling plate 420A. The interface area may be defined as the area formed by where the respective footprint of the chuck 410B interfaces with cooling plate 420A (e.g., such as without the presence of the mesas 412 for substrate support assembly 400A). In a further example, and in some embodiments, the contact area between the chuck 410B and the cooling plate 420A may be between approximately 10% and approximately 50% of the interface area. In another example, and in some embodiments, the contact area between the chuck 410B and the cooling plate 420A may be between approximately 20% and approximately 40% of the interface area.

Figure 4C:
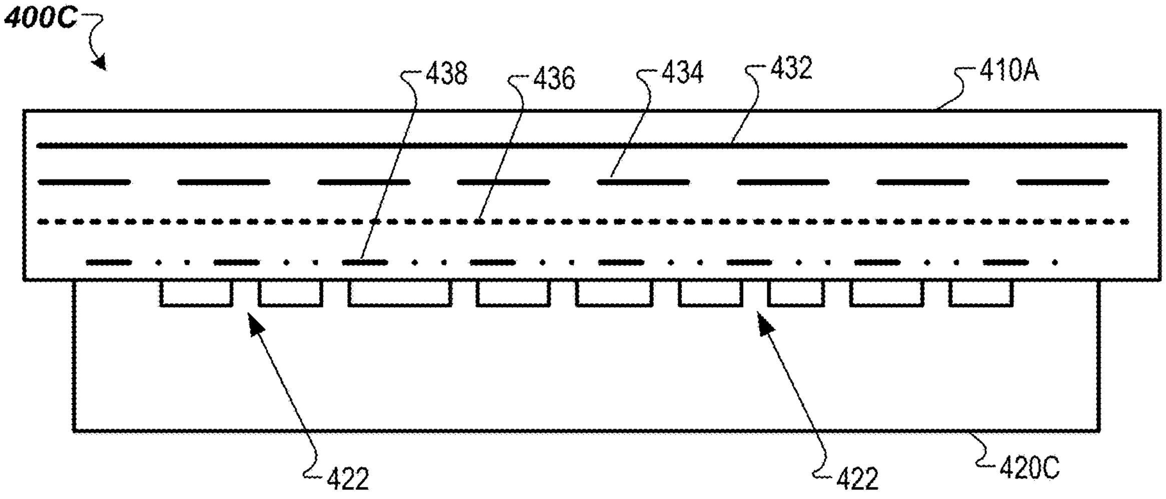

Referring to FIG. 4C, a schematic side view of a substrate support assembly 400C is shown. In some embodiments, the cooling plate 420C forms multiple mesas 422 to support the chuck 410A. The multiple mesas 422 may be otherwise similar to the mesas 412 described herein above with respect to FIG. 4B.

Figure 4D:
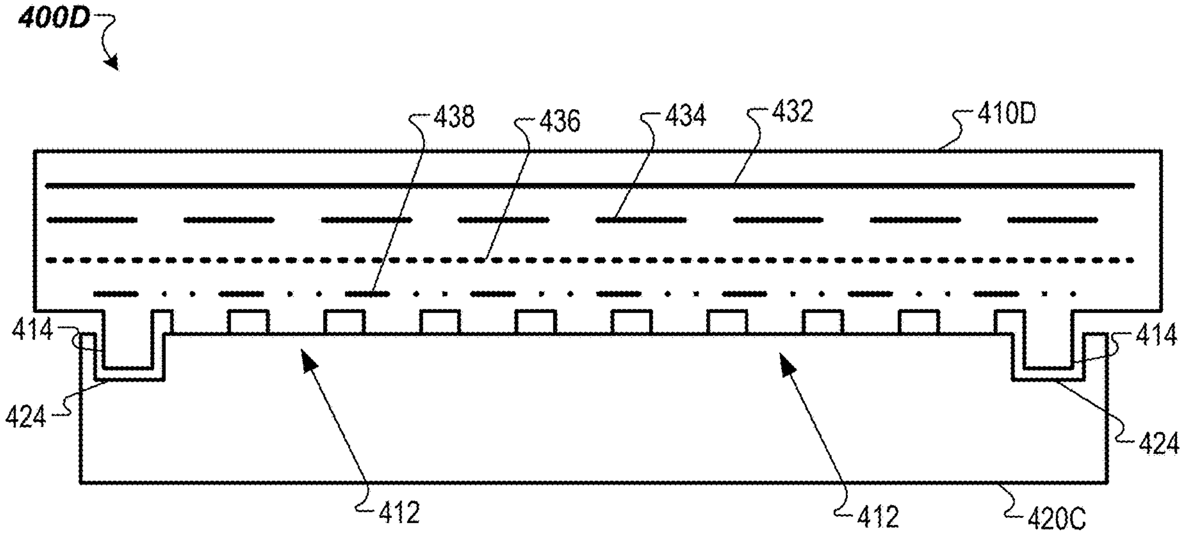

Referring to FIG. 4D, a schematic side view of a substrate support assembly 400D is shown. In some embodiments, chuck 410D forms one or more protrusions 414 the protrude from a bottom surface of the chuck 410D. In some embodiments, the protrusions 414 are a ring-shaped protrusion that protrudes from the bottom of the chuck 410D proximate an outer periphery of the chuck 410D. In some embodiments, the protrusions 414 interface with corresponding grooves 424 that are formed in the top surface of the cooling plate 420C. In some embodiments, the grooves 424 are a ring-shaped groove formed in a top surface of the cooling plate 420C proximate an outer periphery of the cooling plate 420C. In some embodiments, the protrusions 414 protrude between approximately 2 mm and approximately 4 mm from the bottom surface of the chuck 410D. In some embodiments, the grooves 424 have a depth between approximately 2 mm and approximately 4 mm. In some embodiments, the space between the surface of the protrusions 414 and the surface of the grooves 424 is between approximately 90 μm and approximately 110 μm. In some embodiments, the protrusions 414 and the grooves 424 form a labyrinth seal. The labyrinth seal may be to protect components of the chuck 410D and/or of the cooling plate 420C from corrosive and/or harmful process chemistries.

Figure 4E:
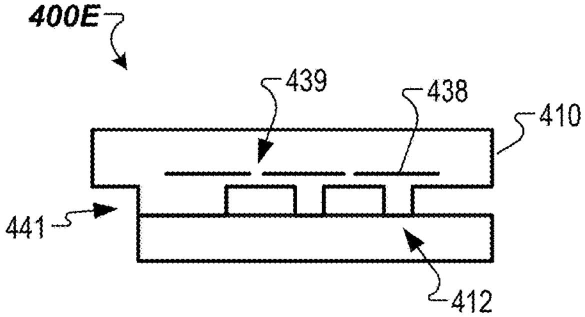
Figure 4F:
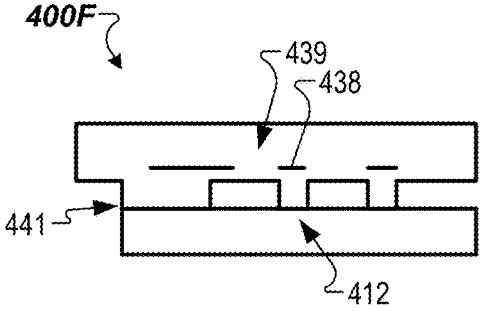

Referring to FIG. 4E, a schematic side view of a portion of a substrate support assembly 400E is shown. In some embodiments, the clamping electrode 438 may be perforated. For example, and in some embodiments, the clamping electrode 438 may form gaps 439 between segments of the clamping electrode 438. In some embodiments, the gaps 439 are disposed between the mesas 412. In some embodiments, the segments of the clamping electrode 438 may be disposed over the mesas 412. In some embodiments, the segments are wider than the mesas 412. In some embodiments, the chuck 410 forms a seal band 441. The seal band 441 may be configured to seal the gas channels formed by the mesas 412 from a process environment. In some embodiments, the gas channels may facilitate heat transfer (e.g., from the chuck 410 to the cooling plate). In some embodiments, the gas channels may have multiple zones of gas flow. Gas flow rates or gas types flowed in each of the multiple zones can be different to alter the heat transfer coefficient. In some embodiments, the seal band 441 is formed proximate an outer periphery of the chuck 410. Referring to FIG. 4F, a schematic side view of a portion of a substrate support assembly 400F is shown. In some embodiments, the segments of the clamping electrode 438 have substantially the same width as the mesas 412 or are narrower than the mesas 412.

Figure 5A:
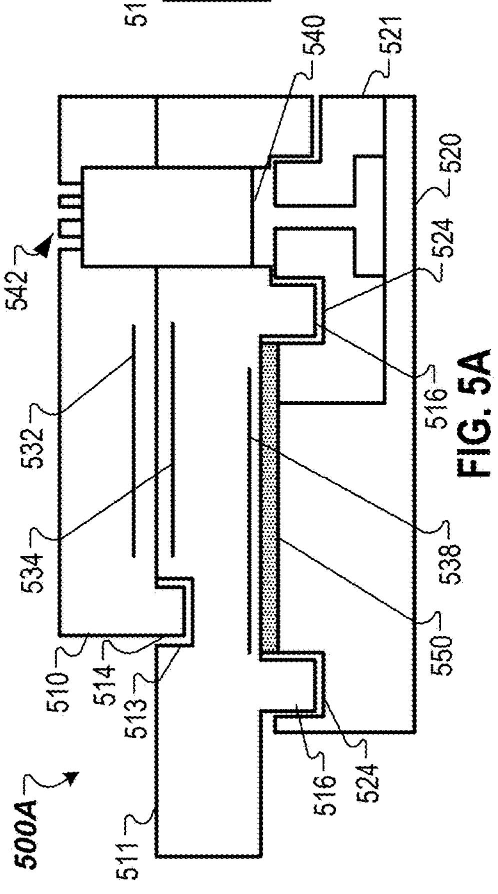
FIGS. 5A-D depict schematic side view of a substrate support assembly, according to some embodiments.

FIGS. 5A-D depict schematic side view of a substrate support assembly, according to some embodiments. Referring to FIG. 5A, a schematic side view of a substrate support assembly 500A is shown. In some embodiments, a chuck includes a first puck plate 510 and a second puck plate 511. The first puck plate 510 and the second puck plate 511 may be electrostatically coupled to each other by a first clamping electrode 532 and/or a second clamping electrode 534. In some embodiments, the second puck plate 511 is electrostatically coupled to a cooling plate 520 by a third clamping electrode 538. In some embodiments, the interface between the second puck plate 511 and the cooling plate 520 is formed by an interface area 550. The interface area 550 may include a bonded interface, a gasket interface, or may include multiple mesas to support the second puck plate 511 on top of the cooling plate 520. In some embodiments, the interface area 550 includes a gasket positioned between the cooling plate 520 and the puck plate 511. The gasket may provide a hermetic seal. In some embodiments, the gasket is sealed from a processing environment by a labyrinth seal formed by protrusion 516 and groove 524. In some embodiments, the first puck plate 510 forms one or more ring-shaped protrusions 514 that fit into corresponding grooves 513 formed in a top surface of the second puck plate 511. In some embodiments, the second puck plate 511 forms one or more ring-shaped protrusions 516 that fit into corresponding grooves 524 formed in a top surface of the cooling plate 520. In some embodiments, the ring-shaped protrusions and corresponding grooves each form a labyrinth seal.

In some embodiments, the first puck plate 510 and/or the second puck plate 511 may form a void for a porous plug 540. The porous plug 540 may be configured to pass a gas (e.g., such as a gas used to transfer heat between a substrate and the substrate support assembly) so that arcing does not occur between one or more electrodes and the cooling plate 520 through the gas passages. In some embodiments, the gas can flow through a gas opening 542, through the porous plug 540, and into a gas distribution assembly 521. The gas distribution assembly 521 may be bonded with the cooling plate 520 such as by an adhesion bond or by a metal bond, etc.

Figure 5B:
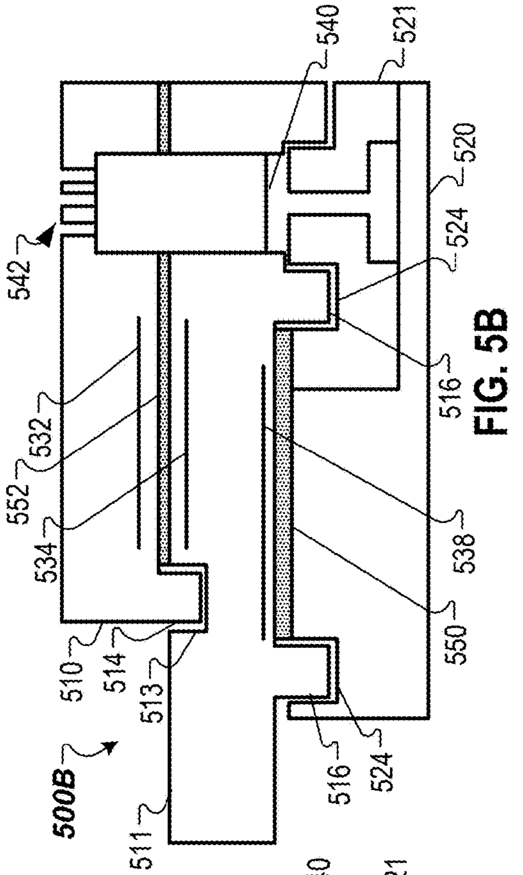

Referring to FIG. 5B, a schematic side view of a substrate support assembly 500B is shown. an interface area 552 may be included between the first puck plate 510 and the second puck plate 511. The interface area 552 may be a bonded interface, a gasket interface, or may include multiple mesas to support the first puck plate 510 on top of the second puck plate 511.

Figure 5C:
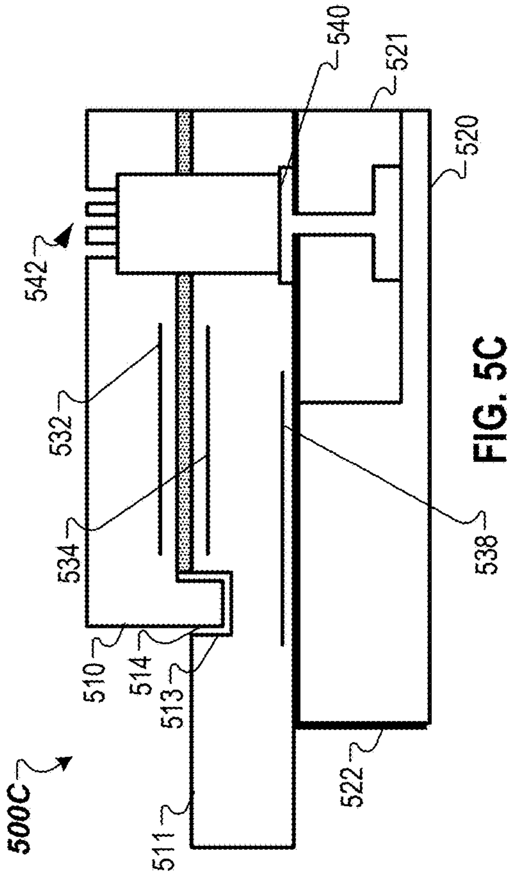

Referring to FIG. 5C, a schematic side view of a substrate support assembly 500C is shown. In some embodiments, the cooling plate 520 includes a protective coating 522 on at least one surface of the cooling plate 520. The protective coating 522 may be included on a top surface of the cooling plate 520 and/or on one or more side surface of the cooling plate 520. In some embodiments, the protective coating 522 is an arcing-resistant coating. For example, the protective coating 522 may be resistant to electrical arcing (e.g., from one or more electrodes such as an RF electrode, etc.). In some embodiments, the protective coating 522 is an anodized coating.

Figure 5D:
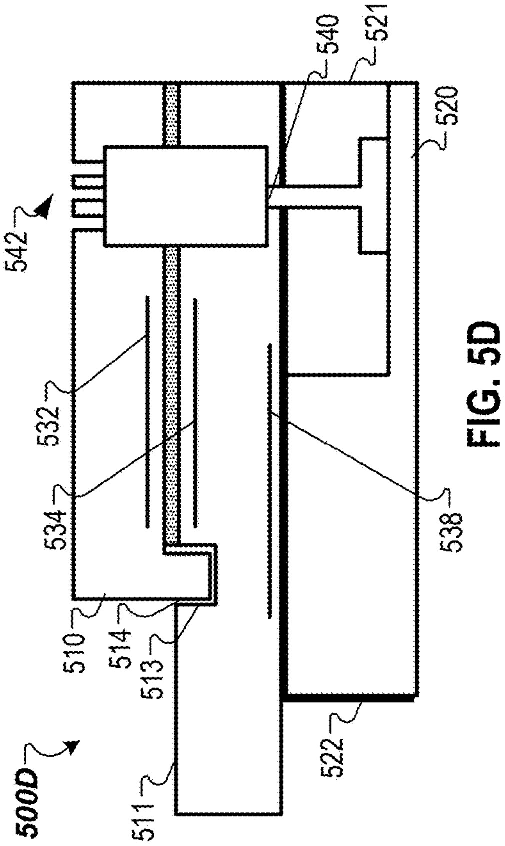

Referring to FIG. 5D, a schematic side view of a substrate support assembly 500D is shown. In some embodiments, the first puck plate 510 and the second puck plate 511 form a pocket for the porous plug 540. The pocket may confine the porous plug 540 both on top of and beneath the porous plug 540. Each of the first puck plate 510 and the second puck plate 511 may form half of the pocket. For example, the first puck plate 510 may form the top half of the pocket and the second puck plate 511 may form the bottom half of the pocket. In some embodiments, the porous plug 540 is inserted into the pocket while the first puck plate 510 and the second puck plate 511 are disassembled from one another. For example, the porous plug 540 may be inserted into the bottom half of the pocket formed by the second puck plate 511 and the first puck plate 510 may be assembled to the second puck plate 511 so that the porous plug 540 fits into the top half of the pocket formed by the first puck plate 510.

Figure 6:
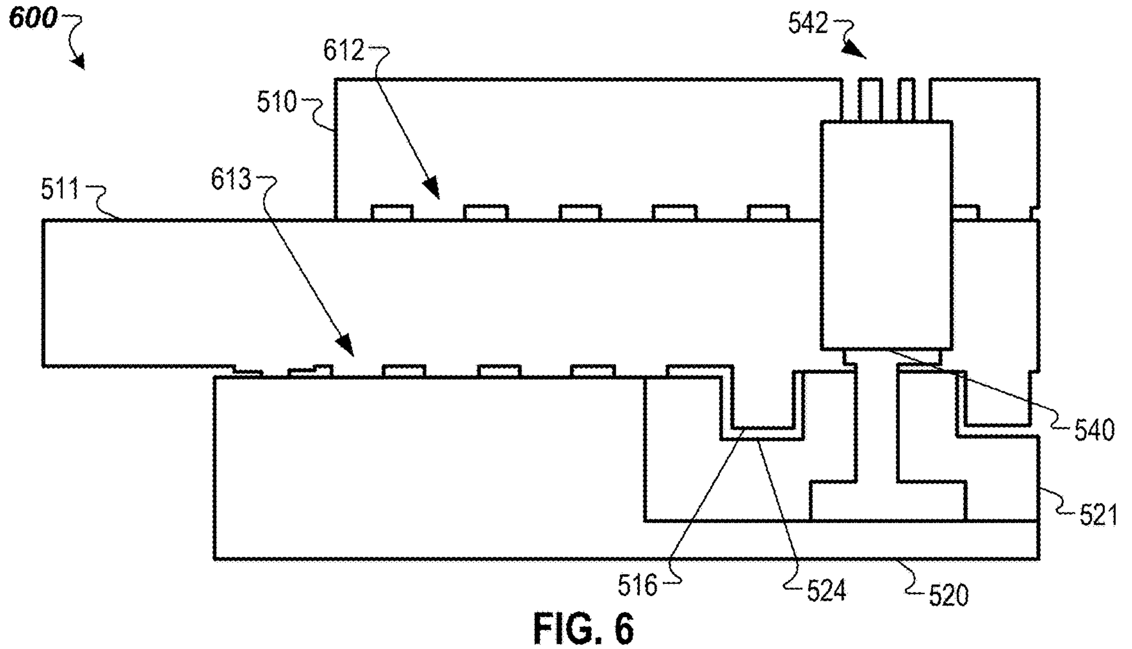
FIG. 6 depicts a schematic side view of a substrate support assembly, according to some embodiments.

FIG. 6 depicts a schematic side view of a substrate support assembly 600, according to some embodiments. In some embodiments, a first puck plate 510 and/or a second puck plate 511 include one or more clamping electrodes (e.g., for electrostatic clamping). In some embodiments, the first puck plate 510 is supported on top of the second puck plate 511 by multiple mesas 612. The multiple mesas 612 may form gas channels between the mesas 612 for flowing a gas to enhance heat transfer between the first puck plate 510 and the second puck plate 511. In some embodiments, the second puck plate 511 is supported on top of a cooling plate 620 by multiple mesas 613. The multiple mesas 613 may form gas channels between the mesas 613 for flowing a gas to enhance heat transfer between the second puck plate 511 and the cooling plate 620. In some embodiments, the second puck plate 511 forms a ring-shaped protrusion 516 that fits into a groove 524 formed in the gas distribution assembly 521 of the cooling plate 620. In some embodiments, the protrusion 516 and the groove 524 form a labyrinth seal. In some embodiments, the gas distribution assembly 521 is bonded to the cooling plate 620. In some embodiments, gas can flow from the gas distribution assembly 521, through the porous plug 540, and through the gas opening 542.

Figure 7:
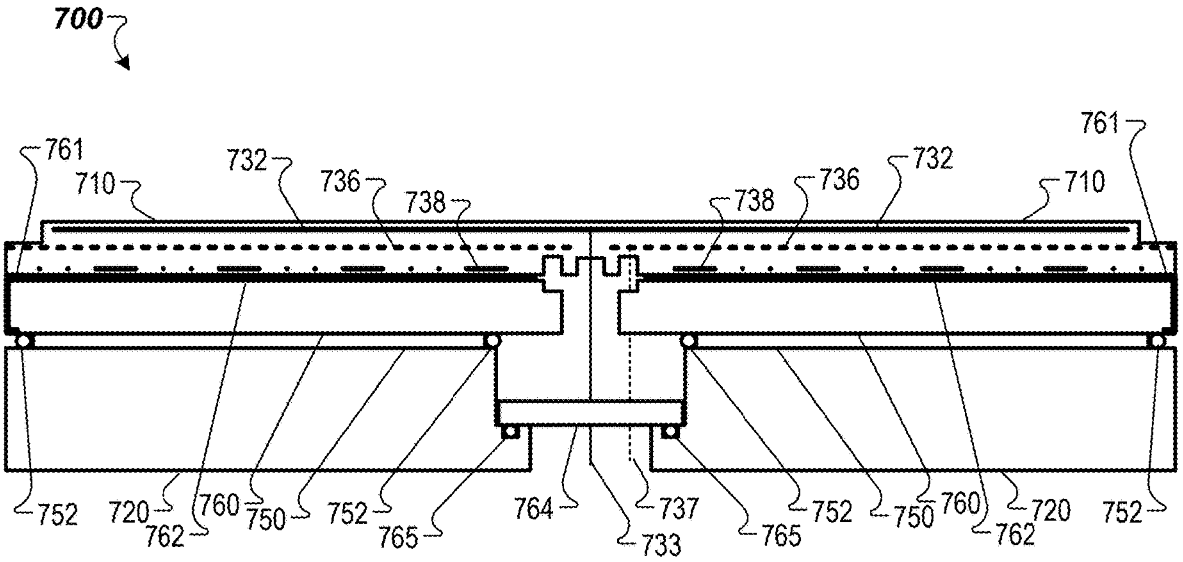
FIG. 7 depicts a schematic side view of a substrate support assembly, according to some embodiments.

FIG. 7 depicts a schematic side view of a substrate support assembly 700, according to some embodiments. In some embodiments, a chuck 710 is disposed on top of a metal disc 760. The metal disc 760 may be disposed on top of a cooling plate 720. An interface 750 may be disposed between the metal disc 760 and the cooling plate 720. The interface 750 may be a bonded interface, a gasket interface, or an interface of multiple mesas as described herein above. In some embodiments, the metal disc 760 forms a seal band 761 proximate the outer periphery of the metal disc 760. The seal band 761 may be configured to seal the interface 750 from a process environment.

In some embodiments, the chuck 710 includes multiple function elements such as a substrate clamp electrode 732, a heating element 736, and/or a clamping electrode 738. In some embodiments, the functional elements are coupled to power lines that extend through a vacuum break 764. The vacuum break 764 may form a vacuum barrier. In some embodiments, the heating element 736 is coupled to an electrical lead 737 that passes through the vacuum break 764 and the substrate clamp electrode 732 is coupled to an electrical lead 733 that extends through the vacuum break 764. The clamping electrode 738 may be an electrode to electrostatically secure the chuck 710 to the metal disc 760 and/or the cooling plate 720.

In some embodiments, the metal disc 760 has a protective coating 762 on at least a top surface of the metal disc 760. The protective coating 762 may be an arc-resistant coating. In some embodiments, the protective coating 762 is an anodized coating. In some embodiments, one or more o-rings 752 are disposed between the metal disc 760 and the cooling plate 720. The o-rings 752 may be to seal the space between the metal disc 760 and the cooling plate 720. In some embodiments, the o-rings 752 are to seal the interface 750 from a harmful and/or corrosive environment. In some embodiments, the vacuum break 764 is sealed with one or more o-rings 765. The o-rings 765 may seal the interface between the cooling plate 720 and the vacuum break 764.

Figure 8A:
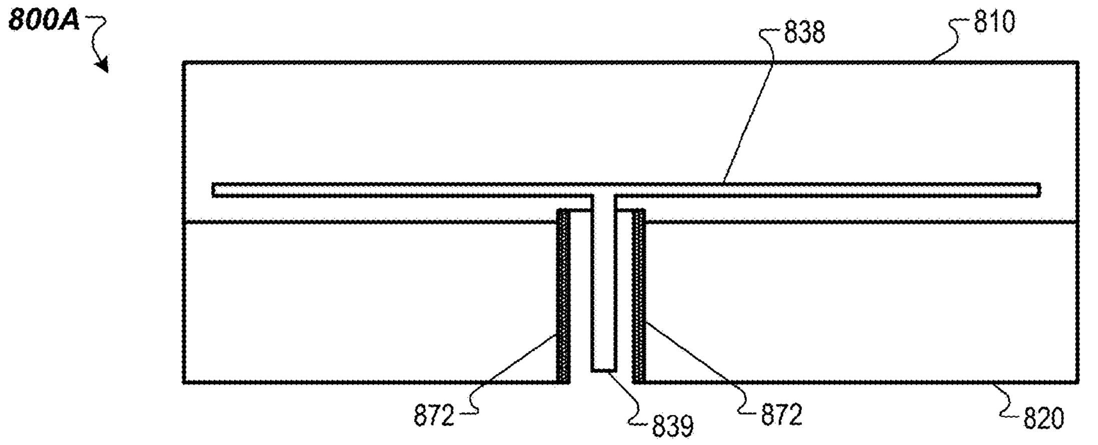
FIGS. 8A-H depict schematic side view of a substrate support assembly, according to some embodiments.

FIGS. 8A-H depict schematic side view of a substrate support assembly, according to some embodiments. Referring to FIG. 8A, a schematic side view of a substrate support assembly 800A is shown. In some embodiments, an electrode 838 is disposed within chuck 810. The electrode 838 may be a clamp electrode or another electrode, such as an RF electrode. In some embodiments, the electrode 838 includes a terminal 839 extending from the electrode 838 into an interior space formed within a cooling plate 820. In some embodiments, the terminal 839 extends from the electrode 838 to a location approximately even with the bottom of the cooling plate 820. A dielectric sleeve 872 may be included on the walls of the interior space. In some embodiments, the dielectric sleeve 872 is an insulator to electrically insulate the terminal 839 from the cooling plate 820. The dielectric sleeve 872 may prevent arcing between the terminal 839 and the cooling plate 820. In some embodiments, the periphery of the cooling plate 820 is anodized. The top surface of the cooling plate 820 may not be anodized. By including the dielectric sleeve 872, arcing to the top surface of the cooling plate 820 may be prevented.

Figure 8B:
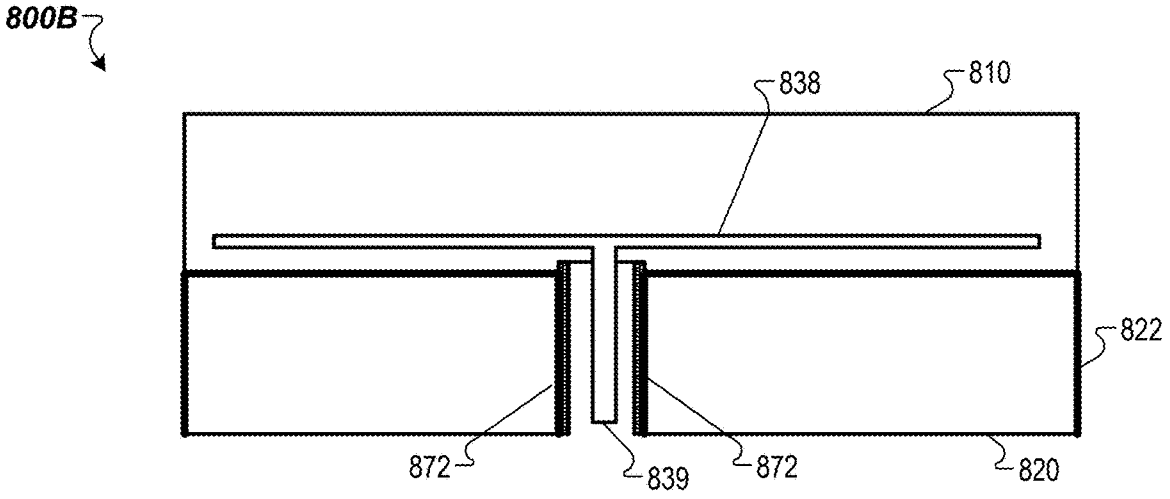

Referring to FIG. 8B, a schematic side view of a substrate support assembly 800B is shown. In some embodiments, the cooling plate 820 may include a protective coating 822 on a top surface and/or on an outer surface of the cooling plate 820. The protective coating 822 may be an anodized coating. In some embodiments, the protective coating 822 is an arcing-resistant coating to prevent arcing from the electrode 838 to the cooling plate 820.

Figure 8C:
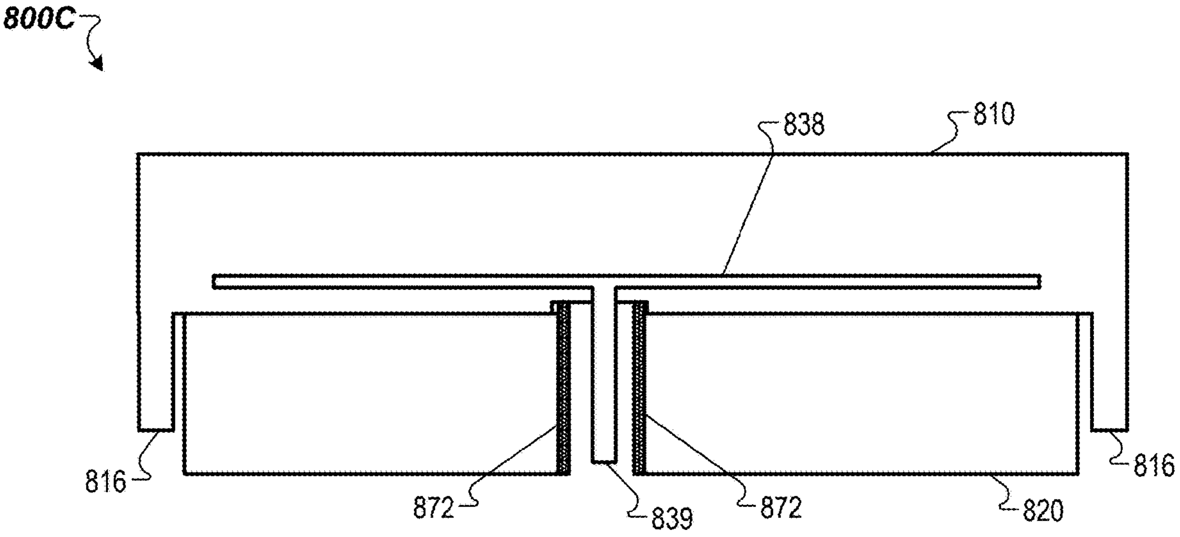

Referring to FIG. 8C, a schematic side view of a substrate support assembly 800C is shown. In some embodiments, the chuck 810 includes a ring-shaped protrusion 816 extending downwards from a bottom surface near the outer periphery of the chuck 810. The ring-shaped protrusion 816 may prevent arcing between the electrode 838 and the cooling plate 820. In some embodiments, the ring-shaped protrusion 816 protects the interface between the cooling plate 820 and the chuck from particle contamination. By including the ring-shaped protrusion 816, arcing to the top surface of the cooling plate 820 may be prevented.

Figure 8D:
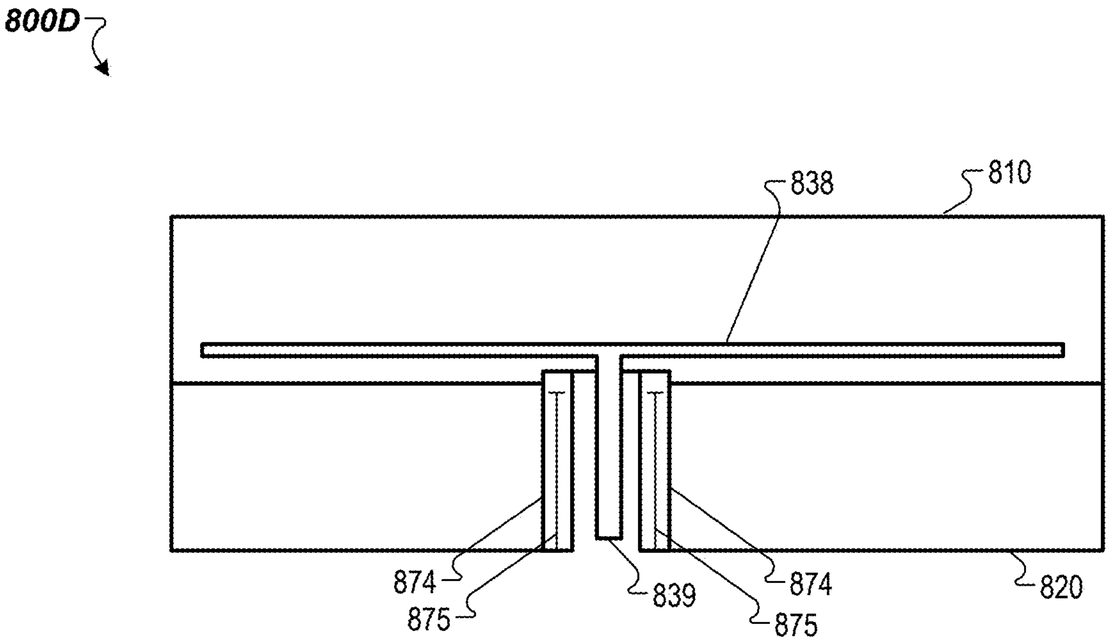

Referring to FIG. 8D, a schematic side view of a substrate support assembly 800D is shown. In some embodiments, a dielectric sleeve 874 is electrostatically clamped to the walls of the interior space formed within the cooling plate 820. In some embodiments, the dielectric sleeve 874 includes electrodes 875. When the electrodes 875 are energized (e.g., with a voltage), an electrostatic force may be generated to electrostatically clamp the dielectric sleeve 874 to the interior walls of the cooling plate 820.

Figure 8E:
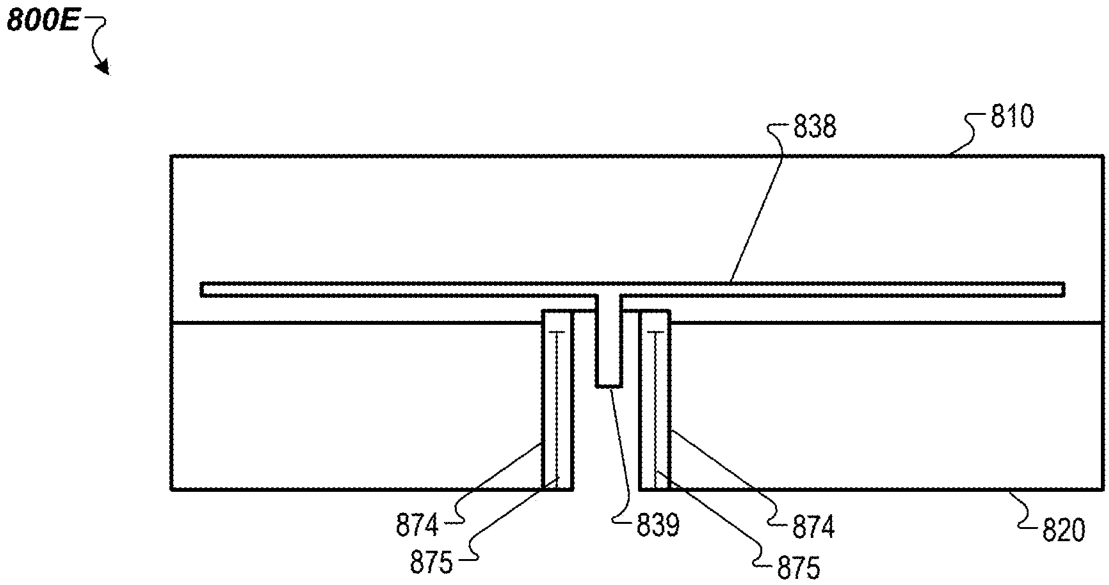

Referring to FIG. 8E, a schematic side view of a substrate support assembly 800E is shown. In some embodiments, the terminal 839 extends from the electrode 838 to a location partially midway between the electrode 838 and the bottom surface of the cooling plate 820.

Figure 8F:
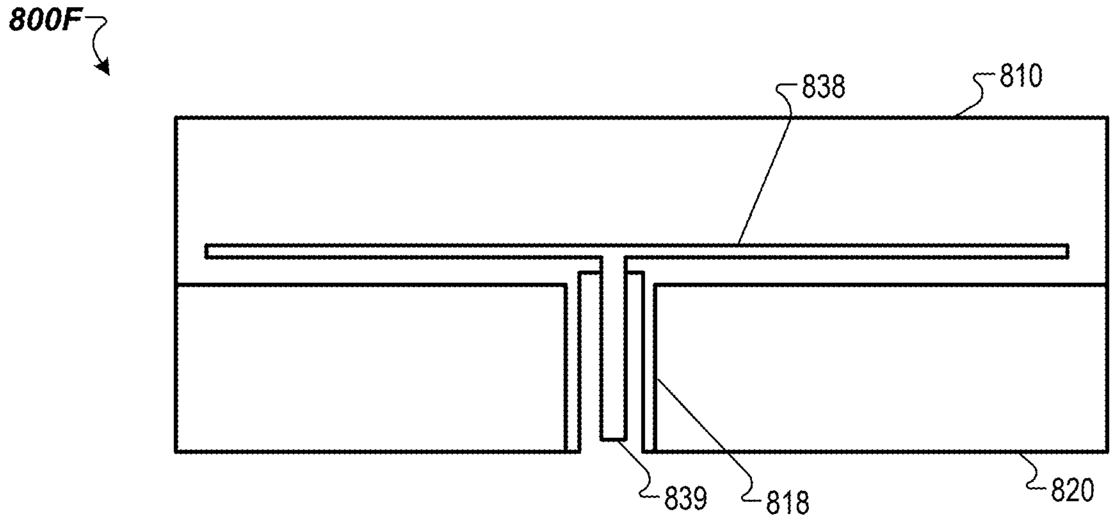

Referring to FIG. 8F, a schematic side view of a substrate support assembly 800F is shown. In some embodiments, the chuck 810 includes a sleeve-like protrusion 818 extending from the bottom surface of the chuck 810 into the interior space formed within the cooling plate 820. In some embodiments, the protrusion 818 forms an insulator to prevent arcing between the terminal 839 and the cooling plate 820. In some embodiments, the protrusion 818 extends from the bottom surface of the chuck 810 to the bottom surface of the cooling plate 820. In some embodiments, the protrusion 818 extends past the end of the terminal 839.

Figure 8G:
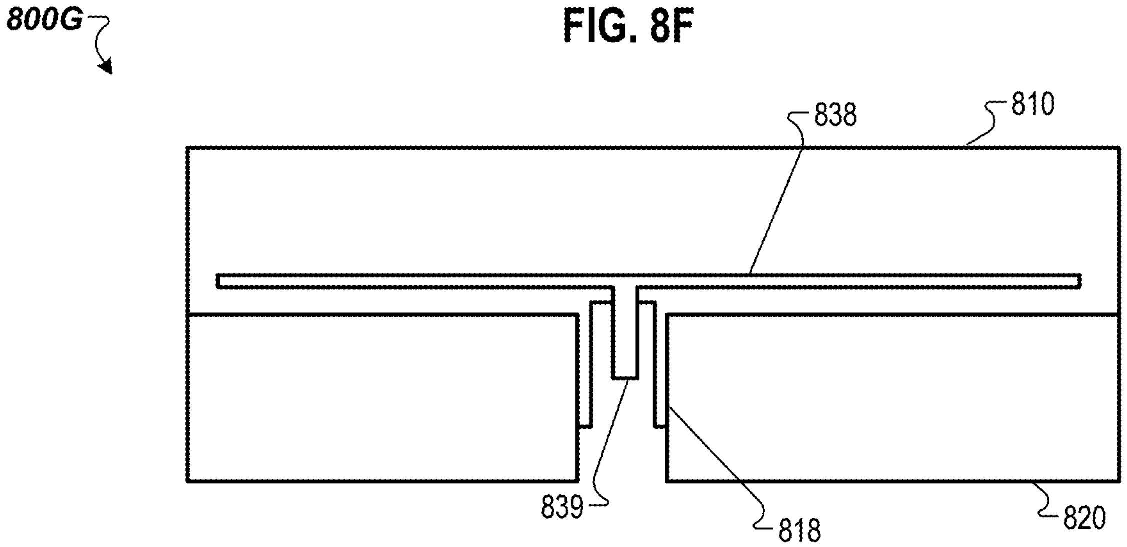

Referring to FIG. 8G, a schematic side view of a substrate support assembly 800G is shown. In some embodiments, the protrusion 818 extends from the bottom surface of the chuck 810 only partially toward the bottom surface of the cooling plate 820. The protrusion 818 may extend past the end of the terminal 839.

Figure 8H:
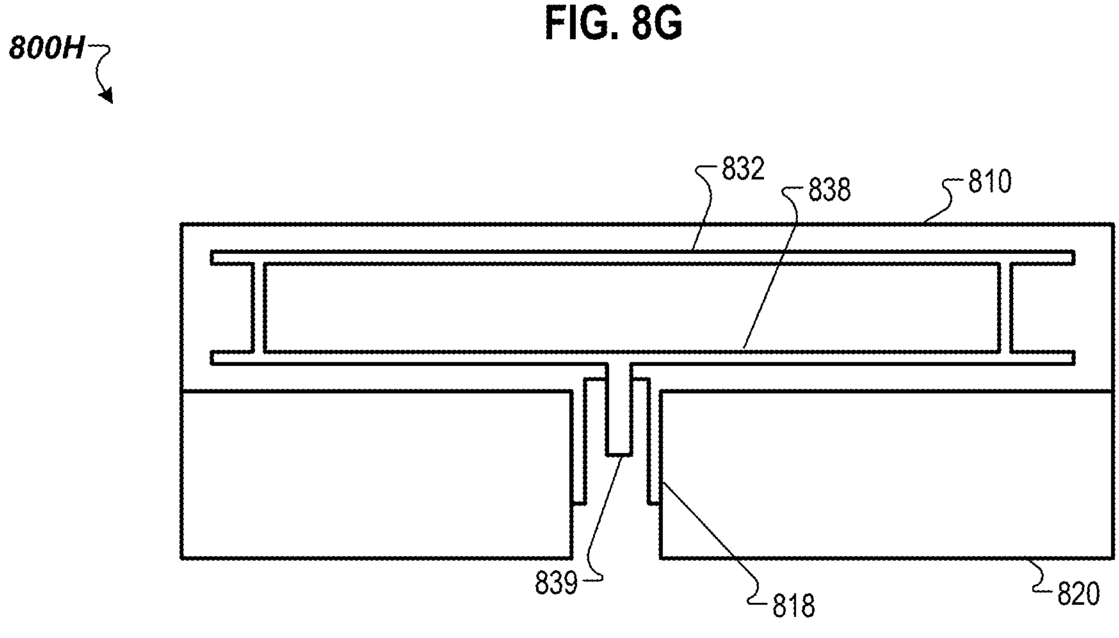

Referring to FIG. 8H, a schematic side view of a substrate support assembly 800H is shown. In some embodiments, an electrode 832 may be electrically coupled to the electrode 838. In some embodiments, the electrode 832 is a substrate-clamping electrode and the electrode 838 is a chuck clamping electrode. For example, when energized, electrode 832 may electrostatically clamp a substrate on the top surface of the chuck 810 and the electrode 838 may electrostatically clamp the chuck 810 to the cooling plate 820.

Figure 9A:
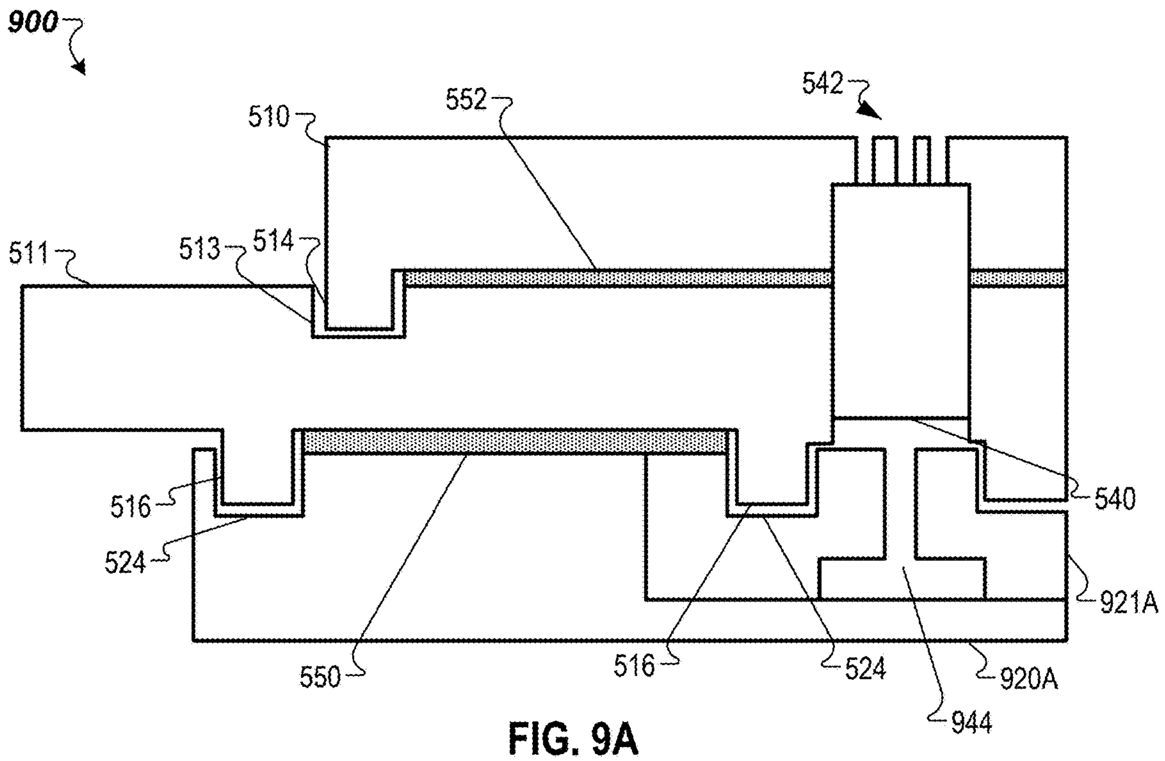
FIGS. 9A-B depict schematic side view of a substrate support assembly, according to some embodiments.
Figure 9B:
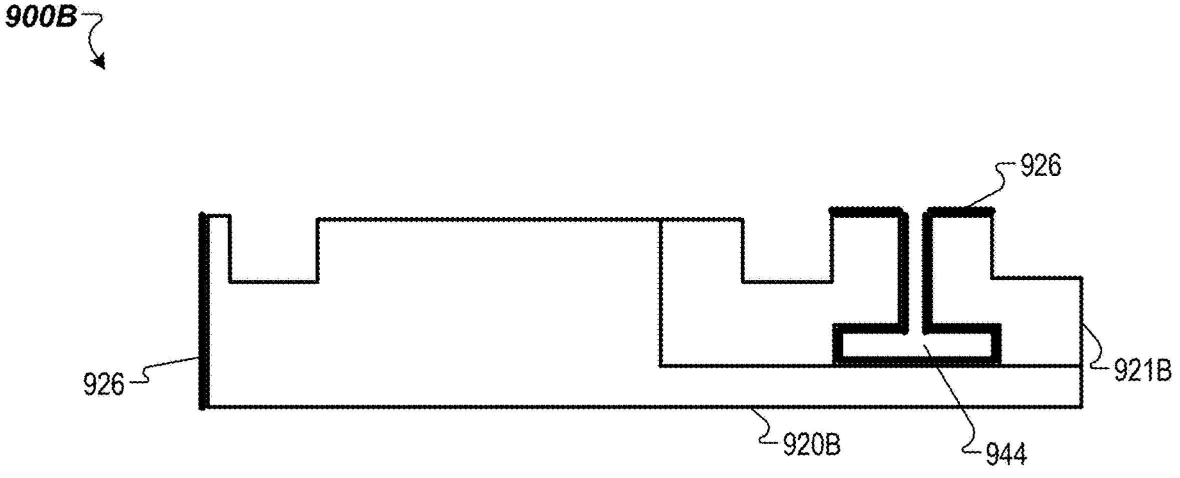

FIGS. 9A-B depict schematic side view of a substrate support assembly, according to some embodiments. Referring to FIG. 9A, a schematic side view of a substrate support assembly 900A is shown. In some embodiments, the interface 550 provides a hermetic seal between the puck plate 511 and the cooling plate 920A. The interface 550 may be protected by labyrinth seals formed by the protrusions 516 and the grooves 524. In some embodiments, gas distribution assembly 921A is bonded to the cooling plate 920A, such as by a metallic or metal bond, etc. In some embodiments, the gas distribution assembly 921A forms an interior cavity 944 for the flow of gas (e.g., from the gas distribution assembly 921A through the porous plug 540 and through the gas opening 542, etc.).

Referring to FIG. 9B, a partial schematic side view of a substrate support assembly 900B is shown. In some embodiments, at least a portion of a cooling plate 920B is coated with a protective coating 926. The protective coating 926 may be an arcing-resistant coating such as an anodized coating. In some embodiments, the outer peripheral surface of the cooling plate 920B is coated with the protective coating 926. In some embodiments, one or more interior surfaces of the gas distribution assembly 921B is coated with the protective coating 926. In some embodiments, the walls of the interior cavity 944 and/or one or more interior passages are coated with the protective coating 926. In some embodiments, the top surface of the gas distribution assembly 921B beneath the porous plug 540 is coated with the protective coating 926.

Figure 10A:
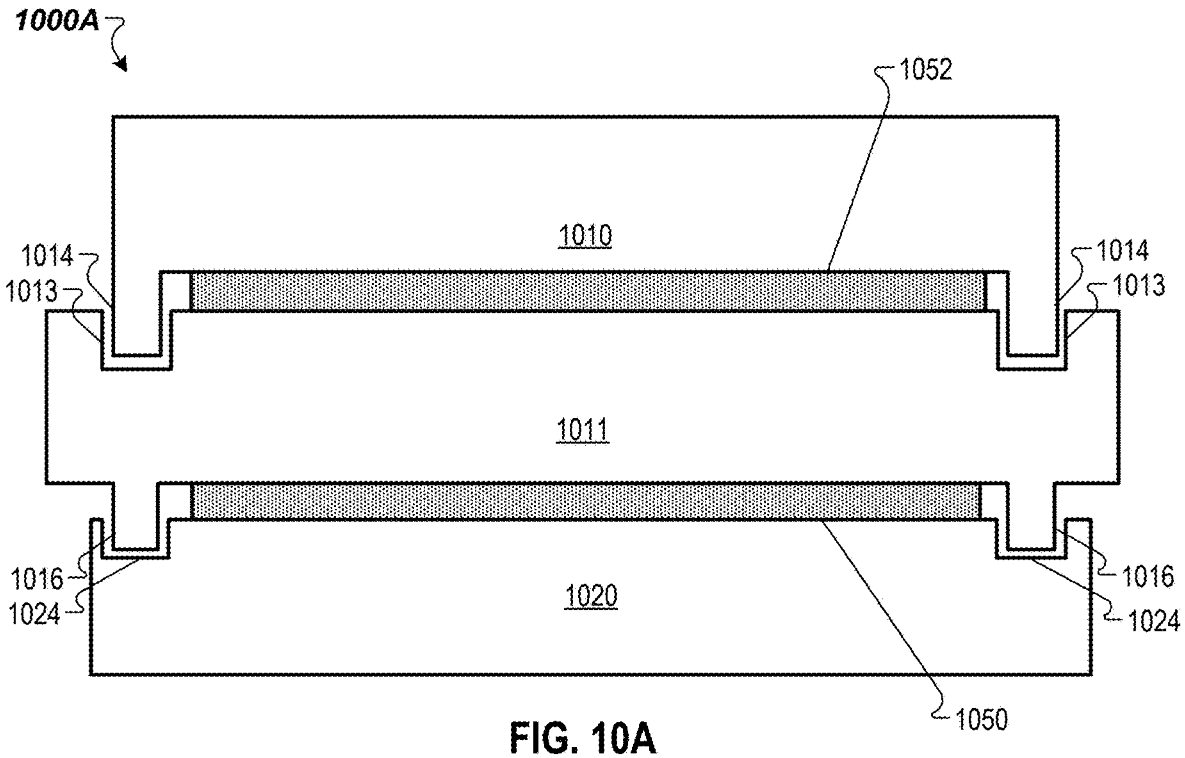
FIGS. 10A-B depict schematic side view of a substrate support assembly, according to some embodiments.
Figure 10B:
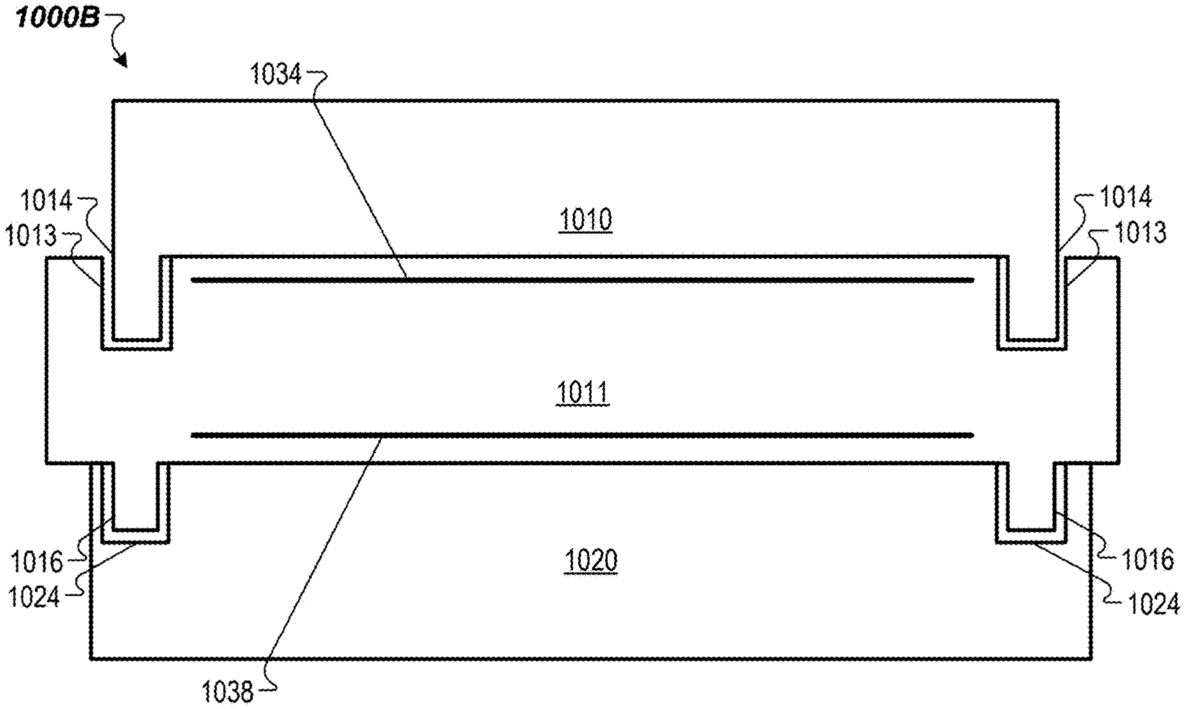

FIGS. 10A-B depict schematic side view of a substrate support assembly, according to some embodiments. Referring to FIG. 10A, a schematic side view of a substrate support assembly 1000A is shown. In some embodiments, a first puck plate 1010 is bonded to a second puck plate 1011 by a bond 1052. In some embodiments, the second puck plate 1011 is bonded to a cooling plate 1020 by a bond 1050. In some embodiment, the first puck plate 1010 forms a ring-like protrusion 1014 near the outer periphery of the puck plate 1010. The ring-like protrusion 1014 may extend downward from a bottom surface of the puck plate 1010. In some embodiments, the ring-like protrusion 1014 is accepted into a corresponding ring-like groove 1013 formed in a top surface of the second puck plate 1011. In some embodiments, the ring-like groove 1013 is formed near the outer periphery of the puck plate 1011. In some embodiments, the protrusion 1014 and the groove 1013 together form a labyrinth seal. The labyrinth seal may protect the bond 1052 from harmful process chemistries in the processing environment.

In some embodiments, the second puck plate 1011 forms a ring-like protrusion 1016 near the outer periphery of the puck plate 1011. The ring-like protrusion 1016 may extend downward from a bottom surface of the puck plate 1011. In some embodiments, the ring-like protrusion 1016 is accepted into a corresponding ring-like groove 1024 formed in a top surface of the cooling plate 1020. In some embodiments, the ring-like groove 1024 is formed near the outer periphery of the cooling plate 1020. In some embodiments, the protrusion 1016 and the groove 1024 together form a labyrinth seal. The labyrinth seal may protect the bond 1050 from harmful process chemistries in the processing environment.

Referring to FIG. 10B, a schematic side view of a substrate support assembly 1000B is shown. In some embodiments, the first puck plate 1010, the second puck plate 1011, and/or the cooling plate 1020 are electrostatically coupled. In some embodiments, the second puck plate 1011 includes a first electrode 1034. When the first electrode 1034 is energized, an electrostatic clamping force may be generated to electrostatically clamp the first puck plate 1010 to the second puck plate 1011. In some embodiments, the second puck plate 1011 includes a second electrode 1038. When the second electrode 1038 is energized, an electrostatic clamping force may be generated to electrostatically clamp the second puck plate 1011 to the cooling plate 1020. In some embodiments, the first electrode 1034 and the second electrode 1038 are separately controlled. However, in some embodiments, the first electrode 1034 and the second electrode 1038 may be controlled together.

Figure 11:
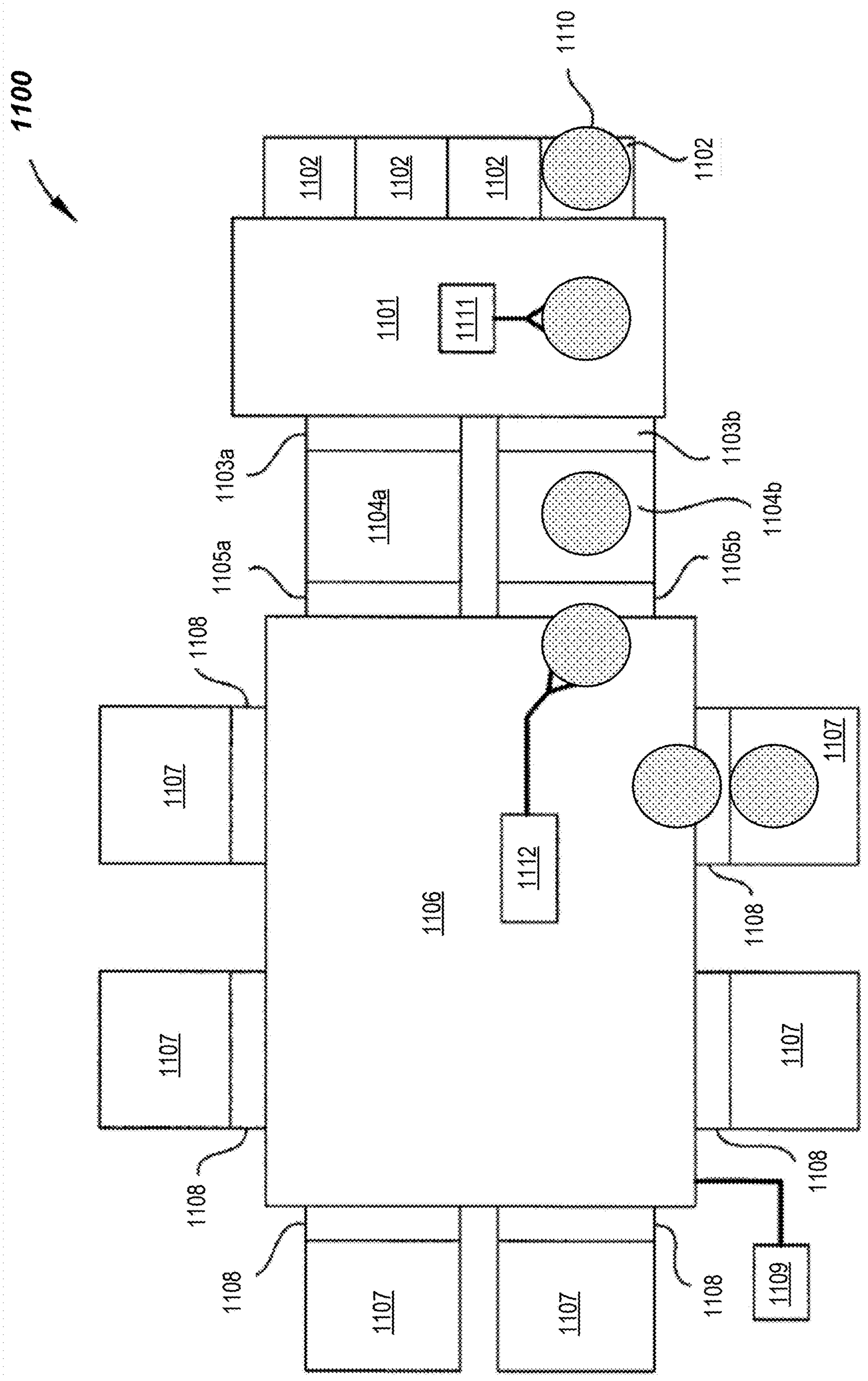
FIG. 11 illustrates a simplified top view of an example processing system, according to some embodiments.

FIG. 11 illustrates a simplified top view of an example processing system 1100, according to some embodiments. The processing system 1100 includes a factory interface 1101 to which a plurality of substrate cassettes 1102 (e.g., front-opening unified pods (FOUPs)) may be coupled for transferring substrates (e.g., wafers such as silicon wafers) into the processing system 1100. The processing system 1100 may also include first vacuum ports 1103*a*, 1103*b* that may couple the factory interface 1101 to respective stations 1104*a*, 1104*b*, which may be, for example, degassing chambers and/or load locks. Second vacuum ports 1105*a*, 1105*b* may be coupled to respective stations 1104*a*, 1104*b* and disposed between the stations 1104*a*, 1104*b* and a transfer chamber 1106 to facilitate transfer of substrates into the transfer chamber 1106. The transfer chamber 1106 includes a plurality of processing chambers (also referred to as process chambers) 1107 (e.g., processing chamber 100) disposed therearound and coupled thereto. The processing chambers 1107 are coupled to the transfer chamber 1106 through respective ports 1108, such as slit valves or the like.

The processing chambers 1107 may include or more of etch chambers, deposition chambers (including atomic layer deposition, chemical vapor deposition, physical vapor deposition, or plasma enhanced versions thereof), anneal chambers, and the like. Some of the processing chambers 1107, such as deposition chambers, may include electrostatic chucks therein, which occasionally undergo replacement. While replacement of electrostatic chucks in conventional systems includes intervention by an operator to replace the electrostatic chuck, the processing system 1100 is configured to facilitate replacement of electrostatic chucks without intervention by an operator.

Factory interface 1101 includes a factory interface robot 1111. Factory interface robot 1111 may include a robot arm, and may be or include a selective compliance assembly robot arm (SCARA) robot, such as a 2 link SCARA robot, a 3 link SCARA robot, a 4 link SCARA robot, and so on. The factory interface robot 1111 may include an end effector on an end of the robot arm. The end effector may be configured to pick up and handle specific objects, such as substrates and/or electrostatic chucks. Alternatively, the end effector may be configured to handle objects such as components of electrostatic chucks. The factory interface robot 1111 may be configured to transfer objects such a substrates, chucks, plates of chucks, etc. between cassettes 1102 (e.g., FOUPs) and stations 1104*a*, 1104*b*.

Transfer chamber 1106 includes a transfer chamber robot 1112. Transfer chamber robot 1112 may include a robot arm with an end effector at an end of the robot arm. The end effector may be configured to handle particular objects, such as substrates and/or electrostatic chucks. The transfer chamber robot 1112 may be a SCARA robot, but may have fewer links and/or fewer degrees of freedom than the factory interface robot 1111 in some embodiments.

A controller 1109 controls various aspects of the processing system 1100. The controller 1109 may be and/or include a computing device such as a personal computer, a server computer, a programmable logic controller (PLC), a microcontroller, and so on. The controller 1109 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 1109 may include a data storage device (e.g., one or more disk drives and/or solid state drives), a main memory, a static memory, a network interface, and/or other components. The controller 1109 may execute instructions to perform any one or more of the methodologies and/or embodiments described herein. In embodiments, the controller is configured to cause one or more robots to replace a used chuck (or plate of a chuck) with a new chuck (or new plate of a chuck). The instructions may be stored on a computer readable storage medium, which may include the main memory, static memory, secondary storage and/or processing device (during execution of the instructions). The controller 1109 may receive signals from and send controls to factory interface robot 1111, wafer transfer chamber robot 1112, non-contact sensors in embodiments.

In embodiments, once a determination is made that a chuck is to be replaced, controller 1109 may de-energize one or more clamping electrodes used to clamp a chuck to a cooling plate (or a plate of a chuck to another plate of the chuck). Controller 1109 may additionally cause a set of lift pins to lift the chuck (or plate(s) of the chuck), and cause robot 1112 to retrieve the chuck and move chuck into load lock 1104*a*, 1104*b*. Controller 1109 may cause robot 1111 to retrieve the chuck from the load lock 1104*a*, 1104*b*, and to place the chuck into a cassette 1102 or SSP. Controller 1109 may further cause robot 1111 to retrieve a new chuck and place the new chuck in a load lock 1104*a*, 1104*b*. Controller 1109 may further cause robot 1112 to retrieve the chuck from load lock 1104*a*, 1104*b* and place the new chuck in process chamber 1107. Controller 1109 may then cause one or more clamping electrodes to energize to electrostatically secure puck plate 1110 to a cooling plate in process chamber 1107.

FIG. 11 schematically illustrates transfer of a puck plate 1110 of an electrostatic chuck or other chuck (or entire chuck) into a processing chamber 1107. According to one aspect of the disclosure, a puck plate 1110 is removed from processing chamber 1107 via factory interface robot 1111 located in the factory interface 1101, or alternatively, is loaded directly into the factory interface 1101. Puck plates are discussed herein, but it should be understood that embodiments described with reference to puck plates also apply to other electrostatic chucks and to other objects other than chucks.

The factory interface robot 1111 may place the puck plate 1110 into station 1104*a* or 1104*b* through a vacuum port 1103*a*, 1103*b*. A transfer chamber robot 1112 located in the transfer chamber 1106 removes the puck plate 1110 from one of the stations 1104*a*, 1104*b* through a second vacuum port 1105*a* or 1105*b*. The transfer chamber robot 1112 moves the puck plate 1110 (which at this point has the correct state) into the transfer chamber 1106, where the puck plate 1110 may be transferred to a destination processing chamber 1107 though a respective port 1108.

While not shown for clarity in FIG. 11, transfer of the puck plate 1110 may occur while the puck plate 1110 is positioned on a carrier or adapter, and the end effectors may pick up and place the carrier or adapter that holds the puck plate 1110. This may enable an end effector that is configured for handling of substrates to be used to also handle the puck plate 1110.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly, comprising:
- a cooling plate; and
- a chuck disposed on the cooling plate, the chuck comprising one or more clamp electrodes to electrostatically secure the chuck to the cooling plate; and
- multiple first mesas formed on a bottom surface of the chuck or formed on a top surface of the cooling plate to separate the chuck from the cooling plate.

2. The substrate support assembly of claim 1, wherein the cooling plate comprises a protective anodized coating on at least a top surface of the cooling plate.

3. The substrate support assembly of claim 1, wherein the multiple first mesas form multiple gas channels between the multiple first mesas for flowing a heat transfer gas between the chuck and the cooling plate.

4. The substrate support assembly of claim 1, wherein the chuck further comprises:
- a first puck plate; and
- a second puck plate disposed on the first puck plate, wherein the first puck plate and the second puck plate are electrostatically secured to the cooling plate by at least one of the one or more clamp electrodes.

5. The substrate support assembly of claim 4, wherein the first puck plate comprises the multiple first mesas, and wherein the second puck plate comprises multiple second mesas on a bottom surface of the second puck plate to separate the second puck plate from the first puck plate.

6. The substrate support assembly of claim 1, wherein the multiple first mesas form a contact area between the chuck and the cooling plate, and wherein the contact area is between approximately 1% and approximately 90% of an interface area between the chuck and the cooling plate.

7. The substrate support assembly of claim 1, wherein the multiple first mesas have a height between approximately 1 micron and approximately 2,000 microns.

8. The substrate support assembly of claim 1, wherein the chuck further comprises one or more ring-shaped protrusions extending from a bottom surface of the chuck, wherein the one or more ring-shaped protrusions are configured to interface with one or more corresponding grooves formed in a top surface of the cooling plate, and wherein the one or more ring-shaped protrusions and the one or more corresponding grooves form a labyrinth seal between the cooling plate and the chuck.

9. The substrate support assembly of claim 8, further comprising:

a gasket positioned between the cooling plate and the chuck, wherein the gasket is configured to provide a hermetic seal, and wherein the gasket is sealed from a processing environment by the labyrinth seal.

10. The substrate support assembly of claim 1, further comprising:

an insulator configured to prevent arcing between a terminal of the one or more clamp electrodes and the cooling plate, wherein the insulator comprises a dielectric sleeve or a sleeve-like protrusion of the chuck.

11. A substrate support assembly, comprising:

a cooling plate forming a void on a top surface of the cooling plate;

a chuck disposed on the cooling plate, the chuck comprising:

one or more clamp electrodes to electrostatically secure the chuck to the cooling plate; and a metal disc disposed within the void and between the cooling plate and the chuck, wherein the metal disc comprises a protective coating on at least one surface of the metal disc.

12. The substrate support assembly of claim 11, wherein the protective coating comprises an anodized coating or a ceramic coating.

13. The substrate support assembly of claim 11, wherein the chuck comprises multiple mesas on a bottom surface of the chuck.

14. The substrate support assembly of claim 13, wherein the multiple mesas form multiple gas channels between the mesas for flowing a heat transfer gas between the chuck and the metal disc, and wherein the metal disc comprises a seal band proximate an outer periphery of the metal disc configured to seal the multiple gas channels from a process environment.

15. The substrate support assembly of claim 13, wherein the multiple mesas form a contact area between the chuck and the metal disc, and wherein the contact area is between approximately 1% and approximately 90% of an interface area between the chuck and the metal disc, and wherein the multiple mesas have a height between approximately 1 microns and approximately 2,000 microns.

16. The substrate support assembly of claim 11, further comprising:

an insulator configured to prevent arcing between a terminal of the one or more clamp electrodes and the cooling plate, wherein the insulator comprises a dielectric sleeve or a sleeve-like protrusion of the chuck.

17. A substrate support assembly, comprising:

a cooling plate;

a chuck disposed on the cooling plate, the chuck comprising:

one or more clamp electrodes to electrostatically secure the chuck to the cooling plate; and one or more ring-shaped protrusions extending from a bottom surface of the chuck, wherein the one or more ring-shaped protrusions are configured to interface with one or more corresponding grooves formed in a top surface of the cooling plate, and wherein the one or more ring-shaped protrusions and the one or more corresponding grooves form a labyrinth seal between the cooling plate and the chuck.

18. The substrate support assembly of claim 17, wherein the cooling plate comprises a protective anodized coating.

19. The substrate support assembly of claim 17, wherein the chuck comprises multiple mesas on a bottom surface of the chuck to separate the chuck from the cooling plate, and wherein the multiple mesas form multiple gas channels between the mesas for flowing a heat transfer gas between the chuck and the cooling plate.

20. The substrate support assembly of claim 17, further comprising:

a gasket positioned between the cooling plate and the chuck, wherein the gasket is configured to provide a hermetic seal, and wherein the gasket is sealed from a processing environment by the labyrinth seal.

* * * * *